(12) United States Patent
Yun et al.

(10) Patent No.: US 11,134,210 B2
(45) Date of Patent: *Sep. 28, 2021

(54) IMAGE SENSORS WITH OPTIMIZED CONTROL OF TRANSFER TRANSISTORS AND ELECTRONIC APPARATUSES INCLUDING THE SAME

(71) Applicant: Samsung Electronics Co., Ltd., Suwon-si (KR)

(72) Inventors: Jung-bin Yun, Hwaseong-si (KR); Kyung-ho Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/898,870

(22) Filed: Jun. 11, 2020

(65) Prior Publication Data

US 2020/0304742 A1    Sep. 24, 2020

Related U.S. Application Data

(63) Continuation of application No. 15/850,356, filed on Dec. 21, 2017, now Pat. No. 10,728,482.

(30) Foreign Application Priority Data

Dec. 29, 2016 (KR) .................... 10-2016-0182880

(51) Int. Cl.
*H04N 5/376* (2011.01)
*H04N 9/07* (2006.01)
(Continued)

(52) U.S. Cl.
CPC ....... *H04N 5/376* (2013.01); *H01L 27/14641* (2013.01); *H04N 5/3741* (2013.01);
(Continued)

(58) Field of Classification Search
CPC ....... H04N 5/357; H04N 5/3575–3658; H04N 5/374–3765; H04N 5/376;
(Continued)

(56) References Cited

U.S. PATENT DOCUMENTS 7,830,437 B2    11/2010 McKee et al.
9,112,355 B2    8/2015 Makino et al.
(Continued)

FOREIGN PATENT DOCUMENTS

JP    2013-157881 A    8/2013

*Primary Examiner* — Paul M Berardesca
(74) *Attorney, Agent, or Firm* — Harness, Dickey & Pierce, P.L.C.

(57) ABSTRACT

An image sensor may optimize control of each pixel and/or each photodiode therein according to various pixel structures therein. An electronic apparatus may include the image sensor. The image sensor may include a plurality of pixels, each including a photodiode and a transfer transistor configured to transfer charges accumulated in the photodiode to a floating diffusion floating diffusion region, and transfer transistor lines respectively connected to gate electrodes of the transfer transistors of the pixels. The transfer transistor lines may receive voltages having different magnitudes.

17 Claims, 16 Drawing Sheets

(51) Int. Cl.
  *H01L 27/146* (2006.01)
  *H04N 5/374* (2011.01)
  *H04N 5/3745* (2011.01)
  *H04N 9/04* (2006.01)

(52) U.S. Cl.
  CPC ..... *H04N 5/37457* (2013.01); *H04N 9/04557* (2018.08); *H04N 9/07* (2013.01); *H01L 27/14612* (2013.01)

(58) Field of Classification Search
  CPC ...... H04N 5/335–379; H01L 27/14641; H01L 27/146–14676
  See application file for complete search history.

(56) References Cited

U.S. PATENT DOCUMENTS

| | | |
|---|---|---|
| 9,137,432 B2 | 9/2015 | Ahn et al. |
| 9,191,636 B2 | 11/2015 | Kiyota |
| 9,215,387 B2 | 12/2015 | Kimura |
| 9,438,836 B2 | 9/2016 | Tashiro et al. |
| 10,728,482 B2 * | 7/2020 | Yun ..................... H04N 5/3741 |
| 2010/0177226 A1 * | 7/2010 | Itonaga ............. H01L 27/14643 348/300 |
| 2011/0062310 A1 | 3/2011 | Kudo |
| 2015/0103221 A1 | 4/2015 | Kimura |
| 2015/0172579 A1 | 6/2015 | Manabe et al. |
| 2015/0256770 A1 | 9/2015 | Seta et al. |
| 2016/0105624 A1 * | 4/2016 | Handa ............... H01L 27/14641 348/303 |
| 2017/0155863 A1 * | 6/2017 | Shikina ................... H04N 9/04 |
| 2018/0027194 A1 | 1/2018 | Yang |

* cited by examiner

FIG. 1B

| Gb | B | Gb | B |
|----|---|----|---|
| R | Gr | R | Gr |
| Gb | B | Gb | B |
| R | Gr | R | Gr |

IMAGE SENSORS WITH OPTIMIZED CONTROL OF TRANSFER TRANSISTORS AND ELECTRONIC APPARATUSES INCLUDING THE SAME

CROSS-REFERENCE TO RELATED APPLICATION

This application is a continuation of U.S. patent application Ser. No. 15/850,356, filed on Dec. 21, 2017, which claims the benefit, under 35 U.S.C. § 119, of Korean Patent Application No. 10-2016-0182880, filed on Dec. 29, 2016, in the Korean Intellectual Property Office, the disclosure of each of which is incorporated herein in its entirety by reference.

BACKGROUND

The inventive concepts relate to image sensors, and more particularly, to image sensors and electronic apparatuses related to control of a transfer transistor of each pixel in one or more image sensors.

An image sensor may include a two-dimensional (2D) array of unit pixels. In some cases, a unit pixel may include one photodiode and a plurality of pixel transistors. Examples of pixel transistors may include transfer transistors, reset transistors, source follower transistors, and selection transistors. As pixel sizes have recently decreased, image sensors that are configured to have a photodiode with an increased area may include a shared pixel structure in which one or more pixel transistors are shared by a plurality of pixels.

SUMMARY

The inventive concepts provide an image sensor that may optimize control of each pixel and/or each photodiode according to various pixel structures and an electronic apparatus including the image sensor.

According to some example embodiments, an image sensor may include a plurality of pixels and a plurality of transfer transistor lines. Each pixel of the plurality of pixels may include a photodiode and a transfer transistor, respectively. The transfer transistor may be configured to transfer charges accumulated in the photodiode to a floating diffusion region. The transfer transistor lines may be connected to gate electrodes of the transfer transistors of the plurality of pixels, respectively. At least two transfer transistor lines, of the plurality of transfer transistor lines, may be configured to receive voltages having different magnitudes.

According to some example embodiments, an image sensor may include a two-dimensional array of 4-shared pixels extending in a first direction and a perpendicular second direction. Each given 4-shared pixel may include four photodiodes, one floating diffusion region shared by the four photodiodes, and four transfer transistors configured to transfer charges accumulated in the four photodiodes to the floating diffusion region. The image sensor may include four transfer transistor lines connected to gate electrodes of the four transfer transistors of the given 4-shared pixel, respectively. The four transfer transistor lines of the given 4-shared pixel may extend in the first direction or the second direction, and at least two transfer transistor lines of the four transfer transistor lines of the given 4-shared pixel may be configured to receive voltages having different magnitudes.

According to some example embodiments, an image sensor may include a two-dimensional array of 8-shared pixels extending in a first direction and a second perpendicular direction. Each given 8-shared pixel may include eight photodiodes, two floating diffusion regions shared by the eight photodiodes, the two floating diffusion regions electrically connected to each other, eight transfer transistors configured to transfer charges accumulated in the eight photodiodes to the two floating diffusion regions, and eight transfer transistor lines connected to gate electrodes of the eight transfer transistors of the given 8-shared pixel, respectively. Each given 8-shared pixel may include two sub-shared pixels, each sub-shared pixel sharing one floating diffusion region and including four photodiodes, At least two transfer transistor lines, of the eight transfer transistor lines, may be configured to receive voltages having different magnitudes.

According to some example embodiments, an image sensor may include a pixel element, the pixel element including a plurality of pixels, each given pixel of the plurality of pixels including a photodiode, and a transfer transistor configured to transfer charges accumulated in the photodiode to a floating diffusion region. The image sensor may include a plurality of transfer transistor lines respectively connected to gate electrodes of the transfer transistors of the plurality of pixels, and a peripheral circuit at least partially surrounding the pixel element. At least two transfer transistor lines of the plurality of transfer transistor lines may be configured to receive voltages having different magnitudes.

According to some example embodiments, an electronic apparatus may include an optical system, an image sensor, and a signal processing circuit. The image sensor may include a pixel element and a peripheral circuit at least partially surrounding the pixel element. The pixel element may include a plurality of pixels and a plurality of transfer transistor lines. Each pixel of the plurality of pixels may include a photodiode and a transfer transistor configured to transfer charges accumulated in the photodiode to a floating diffusion region. The plurality of transfer transistor lines may be connected to gate electrodes of the transfer transistors corresponding to the transfer transistor lines, respectively. At least two transfer transistor lines of the plurality of transfer transistor lines may be configured to receive voltages having different magnitudes.

According to some example embodiments, an electronic apparatus may include a plurality of pixels and a plurality of transfer lines. Each pixel of the plurality of pixels may include a photodiode and a transfer transistor. The transfer transistor may be configured to transfer charges accumulated in the photodiode to a floating diffusion region. The plurality of transfer transistor lines may be configured to apply voltages having different magnitudes to separate, respective transfer transistors of separate, respective pixels of the plurality of pixels.

BRIEF DESCRIPTION OF THE DRAWINGS

Example embodiments of the inventive concepts will be more clearly understood from the following detailed description taken in conjunction with the accompanying drawings in which:

FIG. 1A and FIG. 1B are respectively a circuit diagram illustrating pixels and transfer transistor (TR) lines of an image sensor and a conceptual diagram for explaining a Bayer pattern applied to the pixels, according to some example embodiments;

DETAILED DESCRIPTION

Figure 1A:
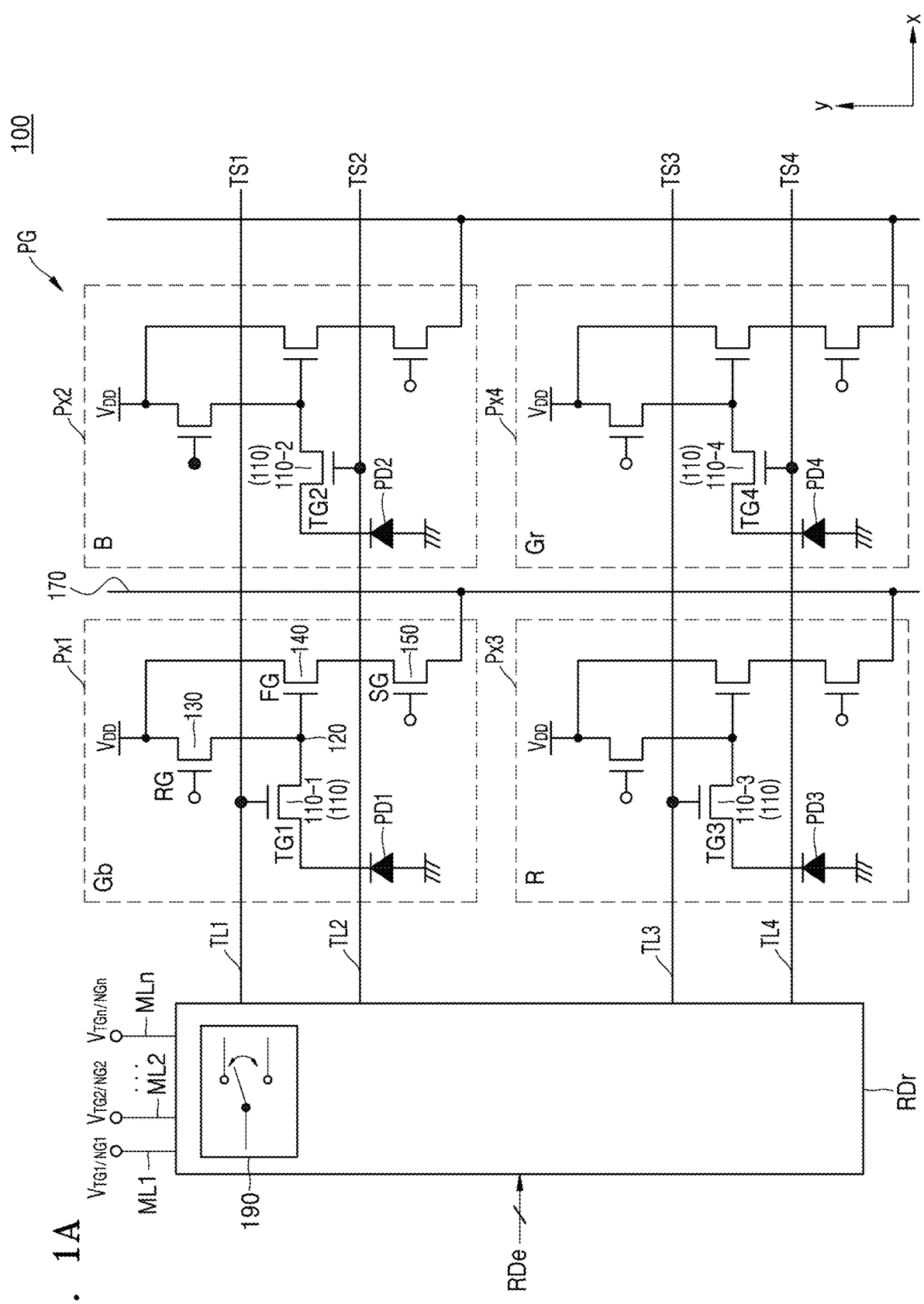

The inventive concepts will now be described more fully with reference to the accompanying drawings, in which embodiments of the inventive concepts are shown. The same elements in the drawings are denoted by the same reference numerals and a repeated explanation thereof will not be given.

Figure 1B:
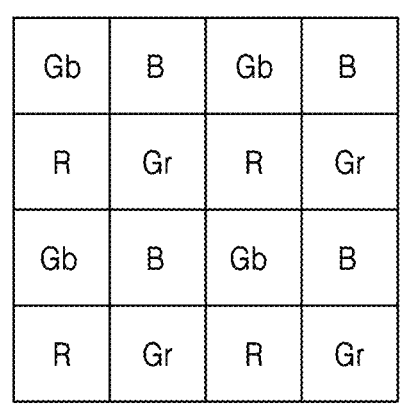

FIG. 1A and FIG. 1B are respectively a circuit diagram illustrating pixels and transfer transistor (TR) lines of an image sensor and a conceptual diagram for explaining a Bayer pattern applied to the pixels, according to some example embodiments.

Referring to FIGS. 1A and 1B, an image sensor 100 according to some example embodiments may include first through fourth pixels Px1 through Px4 in a pixel element 520 (see FIG. 15), first through fourth transfer TR lines TL1 through TL4, and a row drive circuit RDr.

Figure 15:
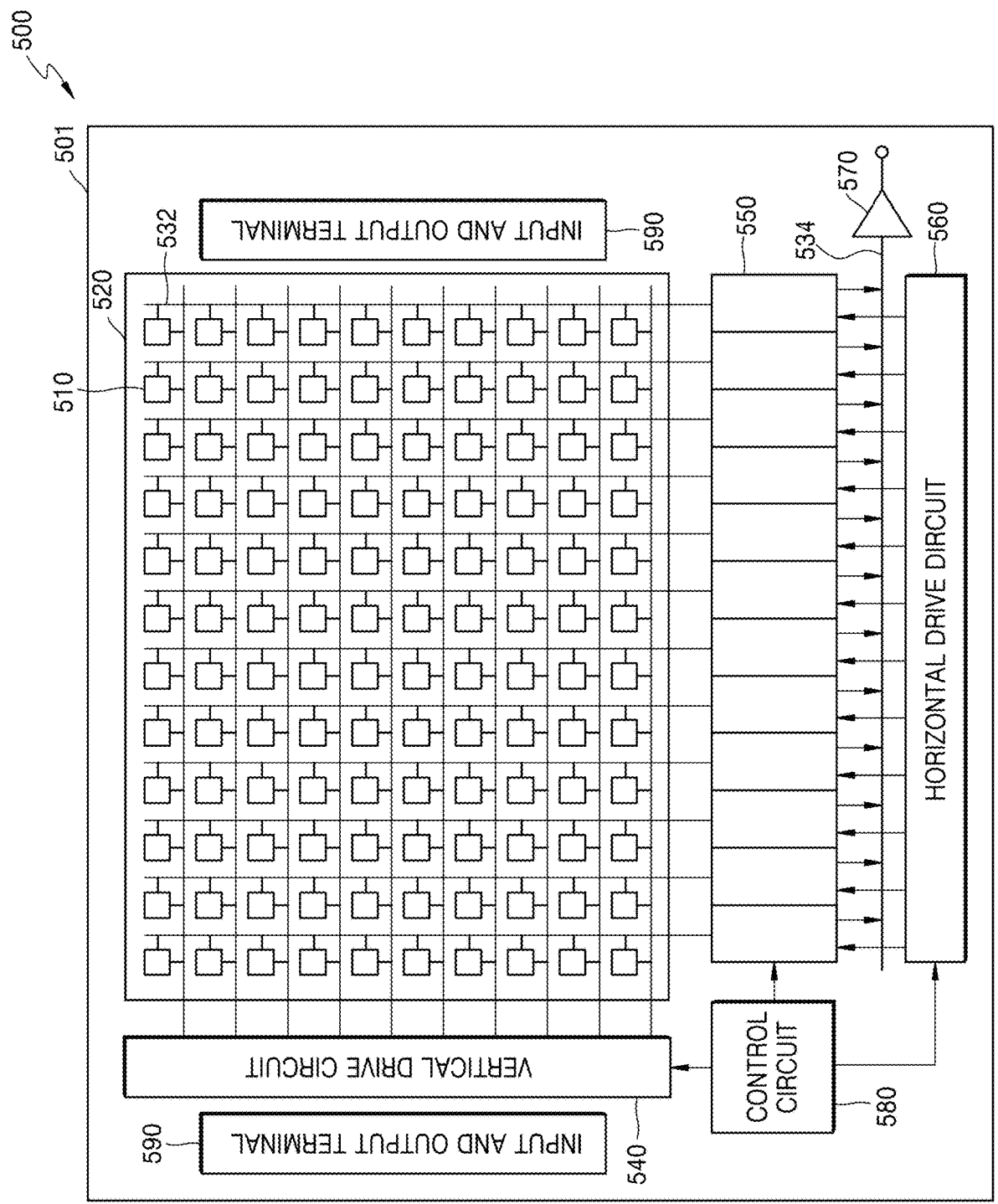
FIG. 15 is a diagram of an image sensor according to some example embodiments.

As shown in FIG. 15, a plurality of pixels 510 may be arranged in (e.g., may include) a two-dimensional (2D) array in the pixel element 520. A pixel group PG including four pixels, that is, the first through fourth pixels Px1 through Px4 that are basic units for displaying a color image, is illustrated in FIG. 1A. A pixel group PG may include exactly four pixels of the plurality of pixels 510. A plurality of the pixel groups PGs may also be arranged in a first direction (e.g., an x-direction) and a second direction (e.g., a y-direction), and thus the pixel groups PGs are arranged in a 2D array in the pixel element 520. As shown in FIG. 1A, a pixel group PG may include a 2D array of pixels Px1 through Px4 that extend in a first direction and a separate second direction.

An image sensor may include one or more pixel groups PGs that include an arrangement (e.g., an array") of colors corresponding to a Bayer pattern, as shown in FIG. 1B. A pixel group including an arrangement corresponding to a Bayer pattern may include a layer on which, for example, a red (R) color and a green (Gr) color are repeatedly (e.g., "alternately") located and a layer on which, for example, a green (Gb) color and a blue (B) color are repeatedly (e.g., "alternately") located. The Gr and Gb colors are the same green color and are simply used for convenience to distinguish a green color located on a layer on which an R color is located from a green color located on a layer on which a B color is located. However, a color arrangement ("configuration") of the pixel groups PGs is not limited to the Bayer pattern. For example, R, G, B, and white (W) colors may be included in a pixel group PG of an image sensor. That is, one green (G) color and one W color, instead of Gr and Gb colors, may be included. In some example embodiments, like a structure in which R and B colors are alternately arranged with a G color therebetween on one layer, even when R and B colors and two G colors are included in one pixel group PG, an arrangement of the R, B, and G colors may be altered, an arrangement interval between layers and/or columns may be altered, or the R, B, and G colors may be arranged in a diagonal structure. The term 'color' used herein may refer to a color filter located in each pixel (also referred to herein as "each given pixel").

Each pixel of the first through fourth pixels Px1 through Px4 may include a photodiode (PD), a transfer transistor (transfer TR 110), a floating diffusion region (FD region 120), a reset transistor (reset TR 130), a source follower transistor (source follower TR 140), and a selection transistor (selection TR 150). The transfer TR 110, the reset TR 130, the source follower TR 140, and the selection TR 150 may be collectively referred to as pixel TRs, and one PD and pixel TRs corresponding to the one PD may at least partially comprise a unit pixel. In some example embodiments, a plurality of PDs and pixel TRs corresponding to the plurality of PDs may at least partially comprise a unit shared pixel (e.g., may at least partially comprise a separate pixel). In the image sensor 100 according to some example embodiments, since pixel TRs corresponding to one PD are all included in one pixel, each pixel of the first through fourth pixels Px1 through Px4 may correspond to a unit pixel. Unit shared pixel structures will be explained below with reference to FIGS. 4, 5, and 11 through 14 in more detail.

For convenience of explanation, the following will be explained based on the first pixel Px1.

Figure 5:
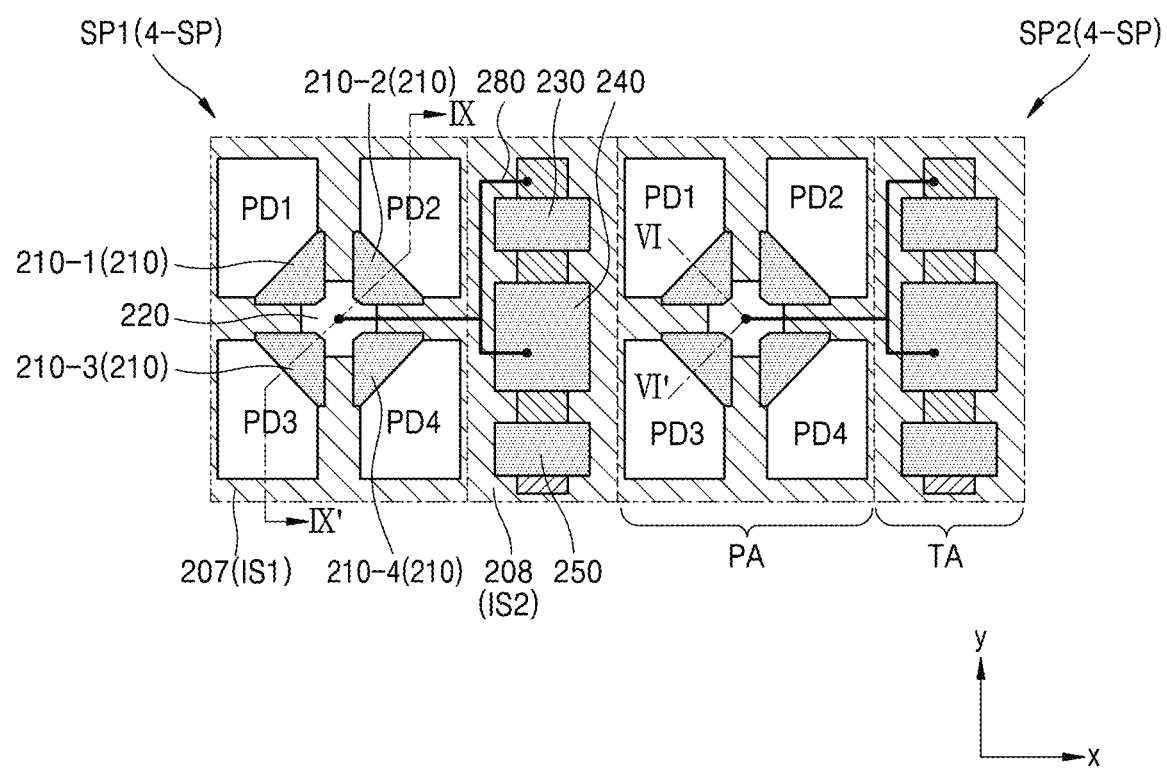
FIG. 5 is a plan view illustrating major parts of a pixel structure of the image sensor of FIG. 4.
Figure 12:
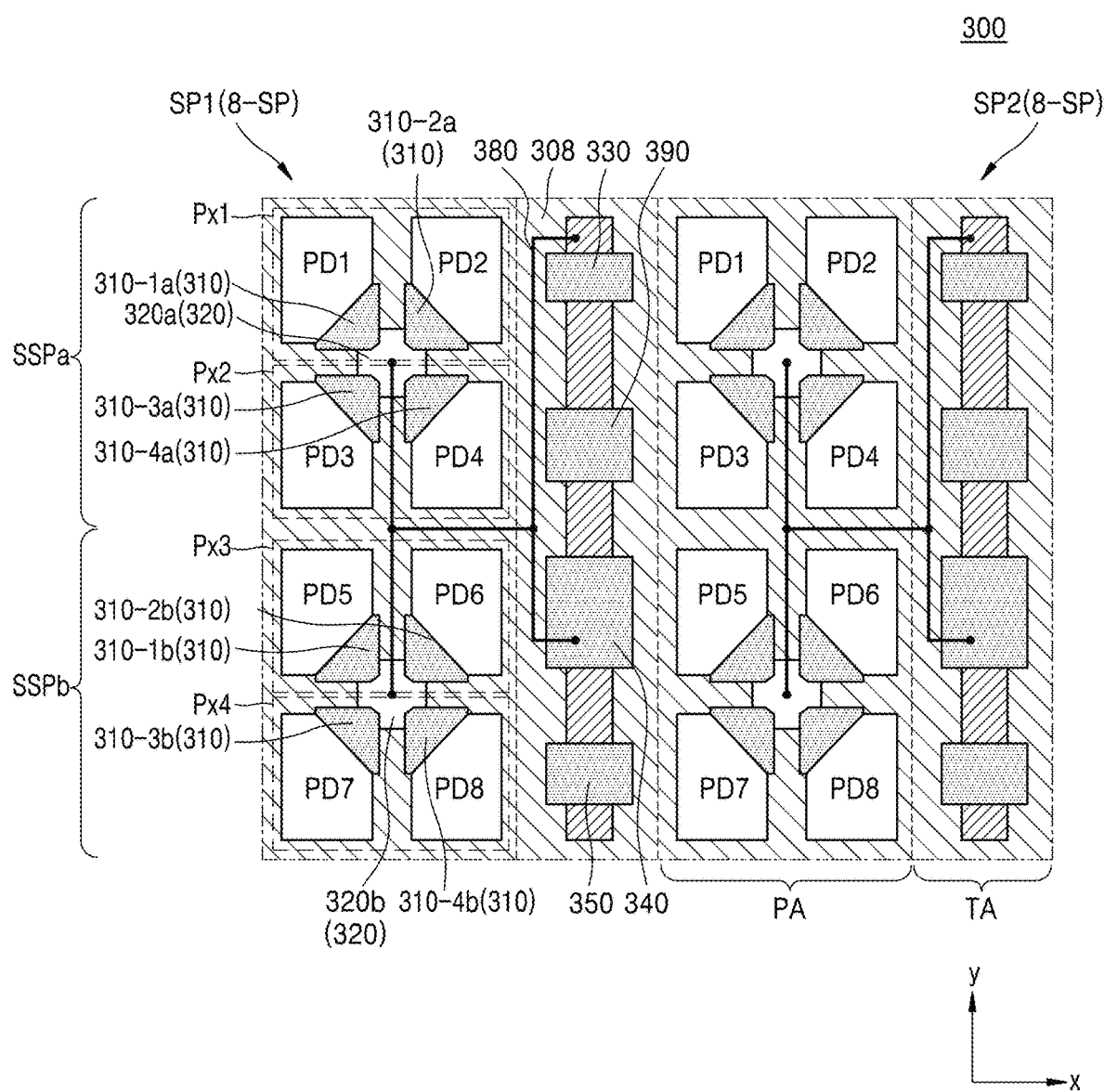
FIG. 12 is a plan view illustrating major parts of a pixel structure of the image sensor of FIG. 11.
Figure 14:
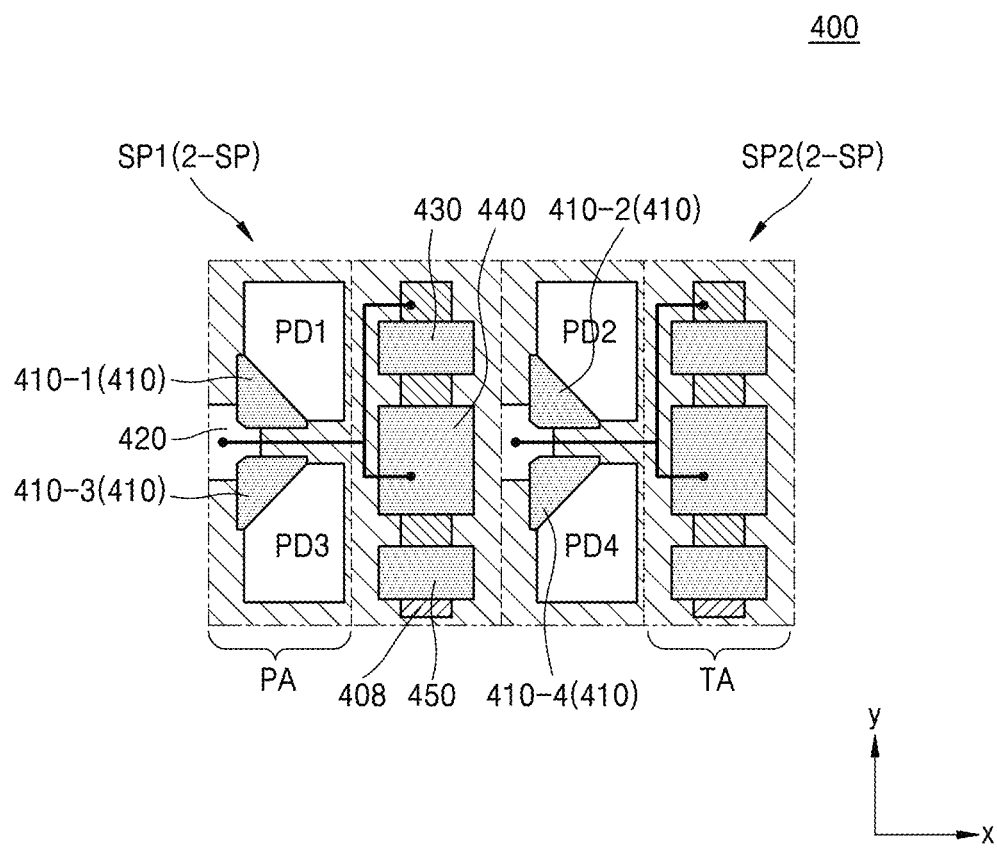
FIG. 14 is a plan view illustrating major parts of a pixel structure of the image sensor of FIG. 13.

As shown in FIGS. 5, 12, and 14, in the first pixel Px1, a first PD PD1, the FD region 120, and a first transfer TR 110-1 may be located in a pixel area PA (e.g., in a common pixel area), and the reset TR 130, the source follower TR 140, and the selection TR 150 may be located in a TR area TA. As a result, an even quantity of photodiodes PD may share the FR region. The reset TR 130, the source follower TR 140, and the selection TR 150 may be sequentially arranged in the TR area TA, for example, in the second direction (e.g., the y-direction). However, a direction in which the reset TR 130, the source follower TR 140, and the selection TR 150 are arranged is not limited to the second direction (e.g., the y-direction).

The first transfer TR 110-1 may include the first PD PD1, a first transfer gate electrode TG1, and the FD region 120, the reset TR 130 may include a source region, a reset gate electrode RG, and the FD region 120, the source follower TR 140 may include a source region, a source follower gate electrode FG, and a drain region, and the selection TR 150 may include a drain region, a selection gate electrode SG, and a source region. As shown in the circuit diagram, the first FD region 120 may correspond to a drain region of the first transfer TR 110-1 and the source region of the reset TR 130, and may be electrically connected to the source follower gate electrode FG. In some example embodiments, the source region of the reset TR 130 and the drain region of the source follower TR 140 may be shared together, and a power voltage VDD may be applied to the source region of the reset TR 130 and the drain region of the source follower TR 140. The source region of the source follower TR 140 and the drain region of the selection TR 150 may be shared together, and a source region of the selection TR 150 may be connected to a column line 170.

An operation in the first pixel Px1 will now be briefly explained. The first transfer TR 110-1 may transfer optical charges accumulated in the first PD PD1 to the FD region 120 in response to a first transfer control signal TS1. The reset TR 130 may reset the FD region 120 in response to a reset signal. The source follower TR 140 may operate according to a voltage level of the FD region 120, and the selection TR 150 may output an output signal of the first pixel Px1 to the column line 170 in response to a selection signal.

The first through fourth transfer TR lines TL1 through TL4 may extend in the first direction (e.g., the x-direction) and may be connected to gate electrodes, that is, first through fourth transfer gate electrodes TG1 through TG4, of first through fourth transfer TRs 110-1 through 110-4 of the first through fourth pixels Px1 through Px4. A direction in which the first through fourth transfer TR lines TL1 through TL4 extend is not limited to the first direction (e.g., the x-direction). Although four transfer TR lines, that is, the first through fourth transfer TR lines TL1 through TL4, are illustrated in FIG. 1A, the first through fourth transfer TR lines TL1 through TL4 correspond to one pixel group PG. Accordingly, a plurality of transfer TR lines may be further arranged in the second direction (e.g., the y-direction) according to the number of pixels or the pixel groups PGs arranged in the second direction (e.g., the y-direction).

First through fourth transfer control signals TS1 through TS4 may be applied to the first through fourth transfer gate electrodes TG1 through TG4 through the first through fourth transfer TR lines TL1 through TL4. Optical signals accumulated in first through fourth PDs PD1 through PD4 may be transferred to the FD regions 120 in response to the first through fourth transfer control signals TS1 through TS4.

The first through fourth transfer control signals TS1 through TS4 may be simultaneously or sequentially applied to the first through fourth transfer TRs 110-1 through 110-4 included in one pixel group PG. For reference, since, in the image sensor 100 according to some example embodiments, the first through fourth pixels Px1 through Px4 do not have a shared pixel structure, simultaneous applying of the first through fourth transfer control signals TS1 through TS4 to the first through fourth transfer TRs 110-1 through 110-4 may not cause a problem. However, when pixels have a shared pixel structure, since the pixels share pixel TRs in addition to transfer TRs, transfer control signals may be sequentially applied to the transfer TRs included in one pixel group PG.

In the image sensor 100 according to some example embodiments, at least two from among the first through fourth transfer control signals TS1 through TS4 may have different voltage levels (e.g., different voltage magnitudes). Restated, at least two transfer transistor lines, of the first through fourth transfer TR lines TL1 through TL4, may be configured to receive voltages having different magnitudes. Restated further, the image sensor 100 may be configured to apply transfer control signals having different voltage magnitudes, to at least two transfer transistor lines, of the first through fourth transfer TR lines TL1 through TL4. For example, a voltage level ("voltage magnitude") of the first transfer control signal TS1 for controlling an on/off operation of the first transfer TR 110-1 may be different from voltage levels ("voltage magnitudes") of the second through fourth transfer control signals TS2 through TS4 for controlling on/off operations of the second through fourth transfer TRs 110-2 through 110-4. Each of the first through fourth transfer control signals TS1 through TS4 may include an on signal and an off signal, and examples of a voltage level difference between the first through fourth transfer control signals TS1 through TS4 may include a voltage level difference ("voltage magnitude difference") between on signals, a voltage level difference ("voltage magnitude difference") between off signals, or a voltage level difference ("voltage magnitude difference") between an on signal and an off signal.

A voltage level (e.g., voltage magnitude) difference between the first through fourth transfer control signals TS1 through TS4 may occur in various ways. For example, any one transfer control signal from among the first through fourth transfer control signals TS1 through TS4 may have a voltage level that is different from those of the other transfer control signals, the first through fourth transfer control signals TS1 through TS4 may be divided into some groups where there is a voltage level difference between the groups, and/or all of the first through fourth transfer control signals TS1 through TS4 may have different voltage levels. A method of grouping the first through fourth transfer control signals TS1 through TS4 according to a voltage level difference between the first through fourth transfer control signals TS1 through TS4 will be explained below with reference to FIGS. 3A through 3C in more detail.

A voltage level difference between the first through fourth transfer control signals TS1 through TS4 may be substantially the same among the pixel groups PG. For example, when a voltage level difference between the first transfer control signal TS1 and the second through fourth transfer control signals TS2 through TS4 in a first pixel group PG of an image sensor is ΔV, a voltage level difference between the first transfer control signal TS1 and the second through fourth transfer control signals TS2 through TS4 in each of one or more other pixel groups PGs of the same image sensor may be ΔV. As such, when a voltage level difference between the first through fourth transfer control signals TS1 through TS4 is the same among the pixel groups PGs, up to four voltage levels may be associated with the first through fourth transfer control signals TS1 through TS4. In some example embodiments, when an off signal is a (−) voltage instead of a ground voltage and the first through fourth transfer control signals TS1 through TS4 have a voltage level difference even at the off signal, up to eight voltage levels may be associated with the first through fourth transfer control signals TS1 through TS4.

However, the concept of a voltage level difference between the first through fourth transfer control signals TS1 through TS4 is not limited thereto. For example, a voltage level difference between the first through fourth transfer control signals TS1 through TS4 may be different among the pixel groups PGs, and in some example embodiments, the number ("quantity") of voltage level types associated with the pixel groups PGs of an image sensor may be increased.

Although not shown, reset TR lines connected to a gate electrode, that is, the reset gate electrode RG, of the reset TR 130 and selection TR lines connected to a gate electrode, that is, the selection gate electrode SG, of the selection TR 150 may extend in the first direction (e.g., the x-direction). However, a direction in which the reset TR lines and the selection TR lines extend is not limited to the first direction (e.g., the x-direction). A reset signal may be applied to the reset TR 130 through the reset TR lines and a selection signal may be applied to the selection TR 150 through the selection TR lines.

The row drive circuit RDr may apply the first through fourth transfer control signals TS1 through TS4 to the first through fourth transfer TRs 110-1 through 110-4 in response to a plurality of row control signals decoded by a row decoder RDe. Restated, in some example embodiments, the row drive circuit RDr may be configured to apply voltages having different magnitudes to at least two transfer TR lines of the first through fourth transfer TR lines TL1 through TL4. In some example embodiments, the row drive circuit RDr may apply a reset signal to the reset TR 130 and a selection signal to the selection TR 150 in response to the row control signals.

In the image sensor 100 according to some example embodiments, the row drive circuit RDr may include a connection controller 190. The connection controller 190 may connect the first through fourth transfer TR lines TL1 through TL4 to first through nth main power lines ML1 through MLn by using a switch. Voltages VTG1/NTG1, . . . , and VTGn/NTGn with different levels may be respectively applied to the first through nth main power lines ML1 through MLn. The voltages VTG1/NTG1, . . . , and VTGn/NTGn with different levels may be fixed voltages (e.g., fixed voltage magnitudes). Accordingly, since first through nth transfer TR lines TL1 through TLn are respectively connected to the first through nth main power lines ML1 through MLn for supplying voltages through the connection controller 190, voltages of different levels may be applied to the first through fourth transfer TR lines TL1 through TL4. Each main power line may be main power line configured to supply either at least two voltages having different magnitudes or a voltage of having one magnitude.

The voltages of different levels may correspond to the first through fourth transfer control signals TS1 through TS4.

When a voltage level difference between the first through fourth transfer control signals TS1 through TS4 is the same among the pixel groups PGs, up to four voltage levels may be applied to the transfer TR lines and thus four main power lines, e.g., the first through fourth main power lines ML1 through ML4, may be included in the image sensor. In some example embodiments, since an on signal and an off signal may be applied together through one main power line, even when the off signal having a (−) voltage has a level difference, four main power lines, e.g., the first through fourth main power lines ML1 through ML4, may be sufficient. If a voltage level difference between the first through fourth transfer control signals TS1 through TS4 is different among the pixel groups PGs, the number of voltage level types associated with the signals applied to the transfer TR lines may be increased to 4 or more and the number of the first through nth main power lines ML1 through MLn corresponding to the voltage level types may also be increased to 4 or more.

The connection controller 190 may include any of various switches such as a field-effect transistor (FET), a relay, a magnetic switch, or a solid-state relay. In the image sensor 100 according to some example embodiments, although the connection controller 190 is located in the row drive circuit RDr, a position of the connection controller 190 is not limited thereto. For example, the connection controller 190 may be located outside the row drive circuit RDr. In other words, as long as the first through nth main power lines ML1 through MLn and the first through fourth transfer TR lines TL1 through TL4 may be appropriately connected to each other, the connection controller 190 may be located at any position.

The image sensor 100 according to some example embodiments may appropriately connect the first through nth main power lines ML1 through MLn for supplying voltages of different levels to the first through fourth transfer TR lines TL1 through TL4 by using the connection controller 190. Accordingly, the voltages of different levels, that is, the first through fourth transfer control signals TS1 through TS4, may be applied to the first through fourth transfer TRs 110-1 through 110-4 in the first through fourth pixels Px1 through Px4 through the first through fourth transfer TR lines TL1 through TL4. The voltages of different levels of the first through fourth transfer control signals TS1 through TS4 may correspond to voltages for optimizing operations of the first through fourth transfer TRs 110-1 through 110-4 according to pixels and/or PDs. Accordingly, the image sensor 100 according to some example embodiments may improve electrical characteristics of the image sensor 100, for example, a full well capacity (FWC), an image lag, a backflow or electron backflow, or a leakage, and may improve wafer yield.

The image sensor 100 according to some example embodiments may be a complementary metal-oxide semiconductor (CMOS) image sensor. As described below, the CMOS image sensor may have any of various structures such as a shared structure or a non-shared structure, and a condition for optimizing a transfer control signal of a transfer TR may be different between adjacent pixels and/or adjacent PDs due to a process variation according to a structure. In some example embodiments, a coupling difference may occur according to adjacent pixels and/or adjacent PDs due to a layout structure, a readout scheme, etc., and thus a condition for optimizing a transfer control signal may be different between adjacent pixels and/or adjacent PDs. A transfer control signal may include a voltage VTG of an on signal and a voltage VNTG of an off signal of a transfer TR, and the voltage VNTG of the off signal may be a ground voltage or a (−) voltage. As such, despite that a condition for optimizing a transfer control signal is different between adjacent pixels and/or adjacent PDs, when transfer control signals having the same voltage level are applied to the adjacent pixels and/or adjacent PDs, operational characteristics of a transfer TR may not be good and electrical characteristics of an image sensor may not be good. However, since the image sensor 100 according to some example embodiments respectively applies transfer control signals having optimized voltage levels to transfer TRs according to adjacent pixels and/or adjacent PDs, the above-described problems may be solved.

Figure 2:
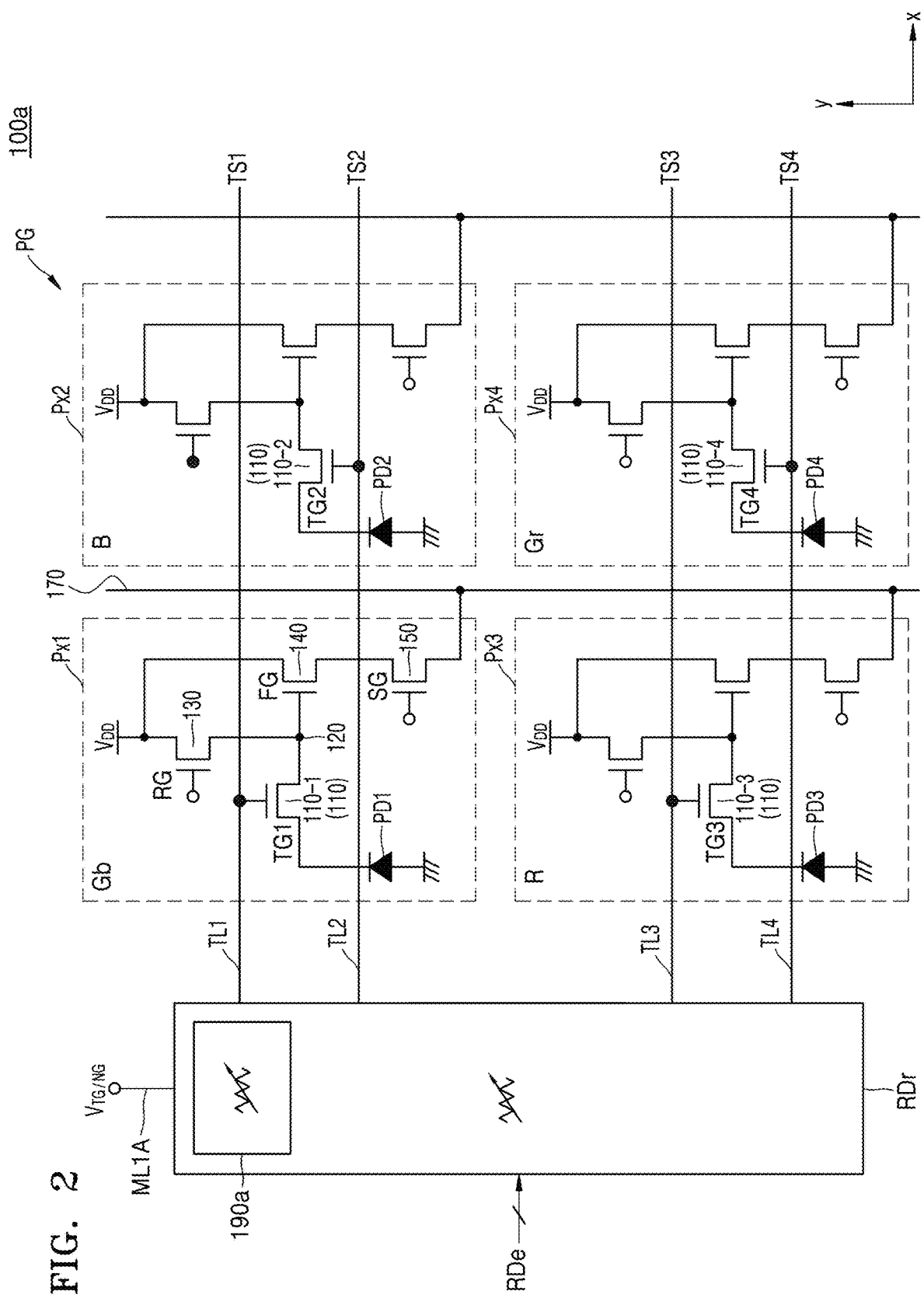
FIG. 2 is a circuit diagram illustrating pixels and transfer TR lines of an image sensor, according to some example embodiments.

FIG. 2 is a circuit diagram illustrating pixels and transfer TR lines of an image sensor 100a according to some example embodiments.

Referring to FIG. 2, the image sensor 100a according to some example embodiments may be different from the image sensor 100 of FIG. 1A in configurations of a connection controller 190a in the row drive circuit RDr and a main power line ML. In detail, in the image sensor 100a according to some example embodiments, the connection controller 190a may include a variable resistor, and there may be one main power line ML1A. In other words, one fixed voltage VTG/NTG (e.g., a voltage having one magnitude) may be supplied through one main power line ML1A, and a level of the supplied voltage VTG/NTG may be changed by the variable resistor of the connection controller 190a and the voltage VTG/NTG with the changed level may be applied to the first through fourth transfer TR lines TL1 through TL4.

The connection controller 190a may include any of various variable resistors. Examples of the variable resistor may include a carbon film variable resistor, a cermet variable resistor, a wire wound variable resistor, and a conductive plastic variable resistor according to a material of a resistor. In some example embodiments, examples of the variable resistor may include a panel mountable potentiometer, a potentiometer, a trimmer potentiometer, a multi-turn precision potentiometer, and an IC potentiometer according to a type.

The image sensor 100a according to some example embodiments may apply voltages of optimized levels, that is, the first through fourth transfer control signals TS1 through TS4, to the first through fourth transfer TRs 110-1 through 110-4 in the first through fourth pixels Px1 through Px4 by applying voltages of different levels to the first through fourth transfer TR lines TL1 through TL4 by using the connection controller 190a. However, the image sensor 100a according to some example embodiments may use one fixed voltage VTG/NTG through one main power line TL, unlike the image sensor 100 of FIG. 1A. Accordingly, the image sensor 100a according to some example embodiments may optimize operations of the first through fourth transfer TRs 110-1 through 110-4 according to pixels and/or PDs, thereby improving electrical characteristics of the image sensor 100a and improving wafer yield.

Figure 3A:
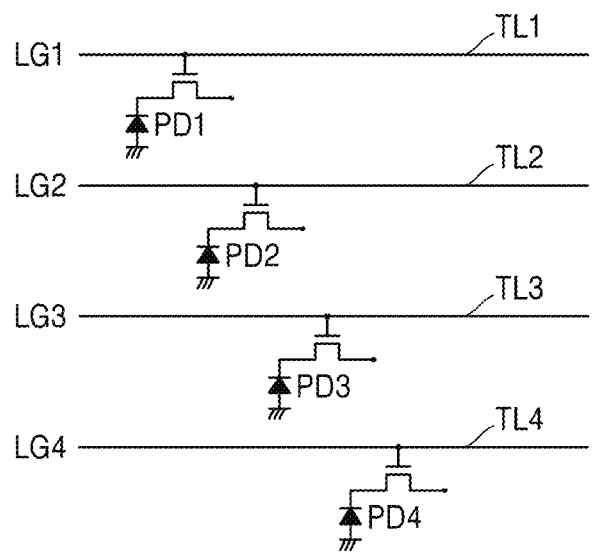
FIG. 3A, FIG. 3B, and FIG. 3C are conceptual diagrams for explaining grouping of transfer TR lines in the image sensor, according to some example embodiments.
Figure 3B:
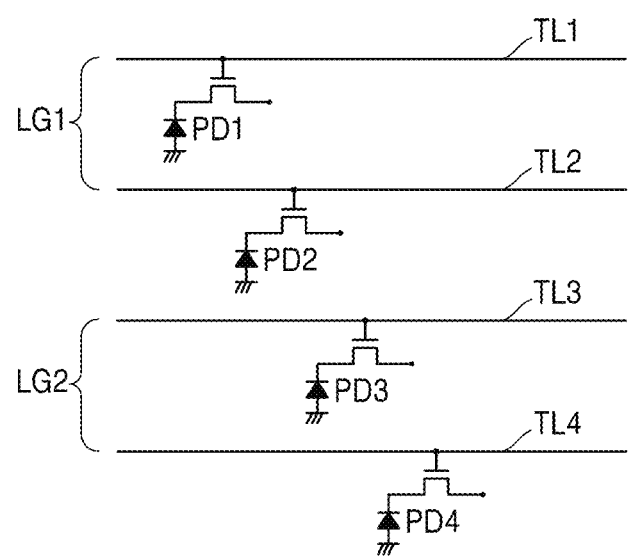
Figure 3C:
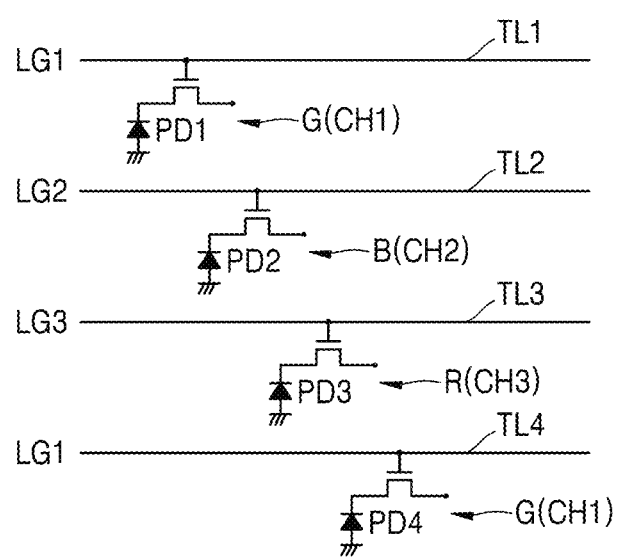

FIG. 3A, FIG. 3B, and FIG. 3C are conceptual diagrams for explaining grouping of transfer TR lines in the image sensor 100 according to some example embodiments.

Referring to FIG. 3A, in the image sensor 100 according to some example embodiments, the first through fourth transfer TR lines TL1 through TL4 may be grouped according to PDs in the pixel group PG (see FIG. 1A). For example, the first transfer TR line TL1 connected to a transfer TR of the first PD PD1 may at least partially comprise a first group LG1, the second transfer TR line TL2 connected to a transfer TR of the second PD PD2 may at least partially comprise a second group LG2, the third transfer TR line TL3 connected to a transfer TR of the third PD PD3 may at least partially comprise a third group LG3, and the fourth transfer line TL4 connected to a transfer TR of the fourth PD PD4 may at least partially comprise a fourth group LG4. In some example embodiments, although not shown in FIG. 3A, the same grouping of transfer TR lines according to PDs may apply to other pixel groups.

As such, when transfer TR lines are grouped according to PDs in the pixel group PG, voltages of four different levels may be applied as transfer control signals. Accordingly, at least four main power lines, that is, the first through fourth main power lines ML1 through ML4, may be included in the image sensor.

The pixel group PG may basically include the first through fourth pixels Px1 through Px4 (see FIG. 1A). In some example embodiments, each pixel may include one PD or two PDs. When each pixel includes one PD, grouping of transfer TR lines according to PDs in the pixel group PG and grouping of transfer TR lines according to pixels in the pixel group PG may provide the same effect. However, when each pixel includes two PDs, grouping of transfer TR lines according to PDs in the pixel group PG and grouping of transfer TR lines according to pixels in the pixel group PG may provide different effects. That is, when transfer TR lines are grouped according to PDs, eight groups may be formed, and when transfer TR lines are grouped according to pixels, four groups may be formed. When transfer TR lines are grouped according to pixels, two transfer TR lines connected to transfer TRs of two PDs forming one pixel belong to one group.

Referring to FIG. 3B, in the image sensor 100 according to some example embodiments, two adjacent transfer TR lines in the pixel group PG may be grouped. Accordingly, the first transfer TR line TL1 and the second transfer TR line TL2 may at least partially comprise the first group LG1, and the third transfer TR line TL3 and the fourth transfer TR line TL4 may at least partially comprise the fourth group LG4. Grouping of transfer TR lines may be selected in more various ways. For example, the first transfer TR line TL1 and the third transfer TR line TL3 may at least partially comprise the first group LG1, and the second transfer TR line TL2 and the fourth transfer TR line TL4 may at least partially comprise the second group LG2. Alternatively, the first transfer TR line TL1 may at least partially comprise the first group LG1, and the second through fourth transfer TR lines TL2 through TL4 may at least partially comprise the second group LG2.

As such, when grouping is performed among transfer TR lines in the pixel group PG, voltages of up to three different levels may be included as transfer control signals. Accordingly, up to three main power lines, e.g., the first through third main power lines ML1 through ML3, may be included in the image sensor. The reason why up to three voltage levels are used is that a case where each transfer TR line at least partially comprises each group belongs to grouping according to PDs or pixels and thus is excluded.

For reference, since the first through fourth transfer TR lines TL1 through TL4 extend in the first direction (e.g., the x-direction of FIG. 1A), that is, a row direction, each of grouping according to PDs of FIG. 3A and grouping among transfer TR lines of FIG. 3B may be referred to as row line grouping. However, grouping of transfer TR lines in the image sensor 100 according to some example embodiments is not limited to row line grouping. For example, column line grouping may be performed according to a direction in which transfer TR lines extend.

Referring to FIG. 3C, in the image sensor 100 according to some example embodiments, transfer TR lines may be grouped according to color channels in the pixel group PG. For example, as shown in FIG. 1A, when the first pixel Px1 corresponds to a Gb color channel CH1, the second pixel Px2 corresponds to a B color channel CH2, the third pixel Px3 corresponds to a R color channel CH3, and the fourth pixel Px4 corresponds to a Gr color channel CH1, the first transfer TR line TL1 and the fourth transfer TR line TL4 corresponding to the Gb and Gr color channels CH1 may at least partially comprise the first group LG1, the second transfer TR line TL2 corresponding to the B color channel CH2 may at least partially comprise the second group LG2, and the third transfer TR line TL3 corresponding to the R color channel CH3 may at least partially comprise the third group LG3. In some example embodiments, each of the Gb and Gr color channels CH1 may be grouped. As such, when each of the Gb and Gr color channels CH1 is grouped and colors are arranged in a Bayer pattern as shown in FIG. 1B, grouping according to color channels may be substantially the same as grouping according to PDs of FIG. 3A. However, when colors are arranged in a pattern other than a Bayer pattern, grouping according to color channels may be different from grouping according to PDs.

Restated, the plurality of pixels included in an image sensor may include at least one pixel group PG in a pixel area, each pixel group of the at least one pixel group may include four pixels of the plurality of pixels, the four pixels included in one pixel group of the at least one pixel group may correspond to one red channel (e.g., the third pixel Px3 corresponds to a R color channel CH3), one blue channel (e.g., the second pixel Px2 corresponds to a B color channel CH2), and two green channels, respectively (e.g., the first pixel Px1 corresponds to a Gb color channel CH1 and the fourth pixel Px4 corresponds to a Gr color channel CH1), and the one pixel group may include a pixel group plurality of transfer transistor lines having a quantity that corresponds to a quantity of photodiodes included in the one pixel group and being configured to receive voltages of different magnitudes according to channels.

Although various grouping methods of transfer TR lines have been explained, the inventive concepts are not limited thereto. For example, transfer TR lines may be grouped in various ways according to actual characteristics of pixels and/or PDs. In some example embodiments, although transfer TR lines are grouped in the same manner among the pixel groups PGs, the inventive concepts are not limited thereto. For example, transfer TR lines may be grouped in different manners among the pixel groups PGs.

Figure 4:
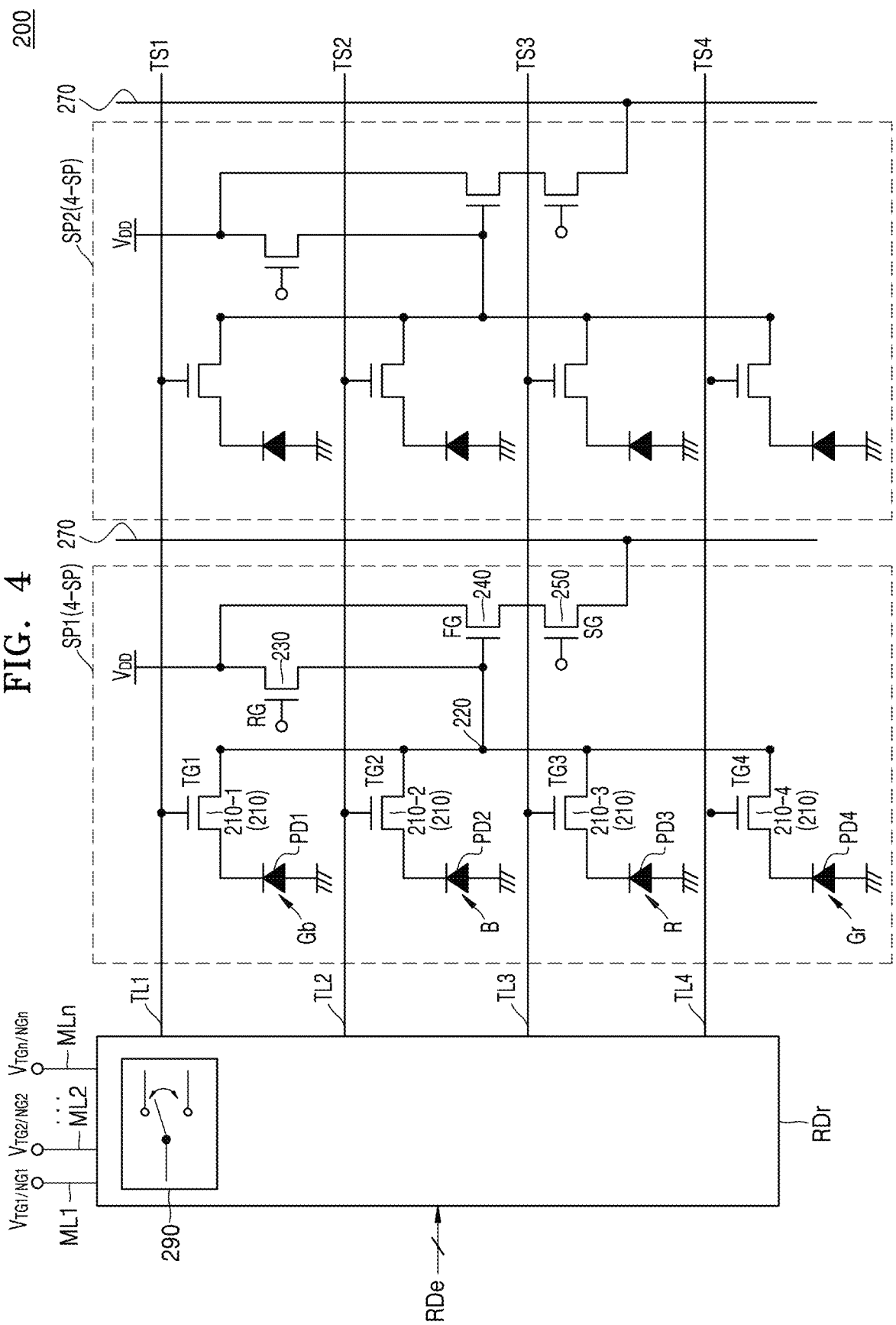
FIG. 4 is a circuit diagram illustrating pixels and transfer TR lines of an image sensor, according to some example embodiments.

FIG. 4 is a circuit diagram illustrating pixels and transfer TR lines of an image sensor 200 according to some example embodiments. FIG. 5 is a plan view illustrating major parts of a pixel element of the image sensor 200 of FIG. 4.

Referring to FIGS. 4 and 5, the image sensor 200 according to some example embodiments may be different from the image sensor 100 of FIG. 1A in that a two-dimensional array of 4-shared pixels 4-SP are included in the pixel element 520 (see FIG. 15). In detail, in the image sensor 200 according to some example embodiments, the 4-shared pixels 4-SP may be located in the pixel area PA and a reset TR 230, a source follower TR 240, and a selection TR 250 other than transfer TRs 210 may be located in the TR area TA. Two 4-shared pixels, e.g., first and second 4-shared pixels SP1 and SP2, may be located adjacent to each other in the first direction (e.g., the x-direction). Although only two 4-shared pixels, that is, the first and second 4-shared pixels SP1 and SP2, are illustrated in FIGS. 4 and 5, a plurality of 4-shared pixels 510 may be arranged in a 2D array in the first direction (e.g., the x-direction) and the second direction (e.g., the y-direction) as shown in FIG. 15.

In the image sensor 200 according to some example embodiments, four pixels may at least partially comprise one 4-shared pixel 4-SP. For example, the first 4-shared pixel SP1 may be configured so that four PDs, e.g., the first through fourth PD1 through PD4, surround and share one FD region 220. Restated, each photodiode PD may be a separate pixel and four pixels may be located in a first quadrant, a second quadrant, a third quadrant, and a fourth quadrant at least partially surrounding the floating diffusion region, respectively. The second 4-shared pixel SP2 may also be configured so that four PDs, that is, the first through fourth PDs PD1 through PD4, share the FD region 220. In the image sensor 200 according to some example embodiments, one PD may at least partially comprise one pixel. Accordingly, unless expressly described otherwise, the PD and the pixel may be interchangeably used.

In the 4-shared pixel 4-SP, sharing of one FD region 220 by four PDs, that is, the first through fourth PDs PD1 through PD4, may be performed through the transfer TRs 210 respectively corresponding to the first through fourth PDs PD1 through PD4 as shown in the circuit diagram of FIG. 4. In detail, a first transfer TR 210-1 corresponding to the first PD PD1, a second transfer TR 210-2 corresponding to the second PD PD2, a third transfer TR 210-3 corresponding to the third PD PD3, and a fourth transfer TR 210-4 corresponding to the fourth PD PD4 may share the FD region 220 as a common drain region.

The concept of sharing in the 4-shared pixel 4-SP may include not only sharing of one FD region 220 by four PDs, that is, the first through fourth PDs PD1 through PD4, but also sharing of the reset TR 230, the source follower TR 240, and the selection TR 250 other than the transfer TRs 210 by the first through fourth PDs PD1 through PD4. That is, the first through fourth PDs PD1 through PD4 constituting the 4-shared pixel 4-SP may share the reset TR 230, the source follower TR 240, and the selection TR 250. The reset TR 230, the source follower TR 240, and the selection TR 250 may be located in the TR area TA in the second direction (e.g., the y-direction).

Except that the reset TR 230, the source follower TR 240, and the selection TR 250 are shared by four PDs, that is, the first through fourth PDs PD1 through PD4, an arrangement or an operation may be substantially the same as that of each of the reset TR 130, the source follower TR 140, and the selection TR 150 located in each of pixels of the image sensor 100 of FIG. 1A. A connection relationship between the TRs 210,230, and 240 and FD region 220 will now be briefly explained with reference to the circuit diagram of FIG. 4. Four PDs, that is, the first through fourth PDs PD1 through PD4, may be connected to source regions of four transfer TRs 210 respectively corresponding to the first through fourth PDs PD1 through PD4. A drain region of each of the transfer TRs 210 may be connected to a source region of the reset TR 230. A common drain region of the transfer TRs 210 may correspond to the FD region 220. The FD region 220 may be connected to a gate electrode, that is, the source follower gate electrode FG, of the source follower TR 240. A drain region of the reset TR 230 and a drain region of the source follower TR 240 may be shared, and a power voltage VDD may be applied to the drain region of the reset TR 230 and the drain region of the source follower TR 240. A source region of the source follower TR 240 and a drain region of the selection TR 250 may be shared, and a column line 270 may be connected to a source region of the selection TR 250. A voltage of the source region of the selection TR 250 may be output as an output signal to the column line 270.

In the image sensor 200 according to some example embodiments, a unit shared pixel may include one 4-shared pixel 4-SP, the reset TR 230, the source follower TR 240, and the selection TR 250 of the TR area TA corresponding to the 4-shared pixel 4-SP, and the transfer TRs 210 whose number corresponds to the number of shared PDs may be included in the 4-shared pixel 4-SP. Restated, a quantity of the plurality of transfer TR lines of the image sensor 200 may correspond to a quantity of photodiodes PD included in a shared pixel (e.g., SP1, SP2, etc.) of the image sensor 200. Such transfer TR lines may be configured to receive voltages having different magnitudes. As described above, the reset TR 230, the source follower TR 240, and the selection TR 250 of the TR area TA and the transfer TRs 210 are referred to as pixel TRs. The image sensor 200 according to some example embodiments may be, for example, a CMOS image sensor.

The image sensor 200 according to some example embodiments may include a connection controller 290 in the row drive circuit RDr. A configuration and a function of the connection controller 290 are the same as those of the connection controller 190 of the image sensor 100 of FIG. 1A. Accordingly, a plurality of main power lines, e.g., the first through nth main power lines ML1 through MLn for supplying fixed voltages VTG1/NTG1, . . . , and VTGn/NTGn with different levels may be provided in the image sensor 200 according to some example embodiments. In some example embodiments, the first through nth main power lines ML1 through MLn may be connected to the first through fourth transfer TR lines TL1 through TL4 through the connection controller 290 that is a switching device and may apply voltages of different levels to the transfer TRs 210 of the first through fourth PDs PD1 through PD4.

The image sensor 200 according to some example embodiments may employ the connection controller 190a and the main power line ML of the image sensor 100a of FIG. 2, instead of the connection controller 290 and the first through nth main power lines ML1 through MLn. In some example embodiments, various grouping methods of transfer TR lines of FIGS. 3A through 3C may apply to the image sensor 200 according to some example embodiments.

The image sensor 200 according to some example embodiments may apply voltages of optimized levels, that is, the first through fourth transfer control signals TS1 through TS4, to first through fourth transfer TRs 210-1 through 210-4 in the 4-shared pixel 4-SP by applying voltages of different levels to the first through fourth transfer TR lines TL1 through TL4 by using the connection controller 290. Accordingly, the image sensor 200 according to some example embodiments may optimize operations of the first through fourth transfer TRs 210-1 through 210-4 according to pixels and/or PDs, thereby improving electrical characteristics of the image sensor 200 and improving wafer yield.

Figure 6A:
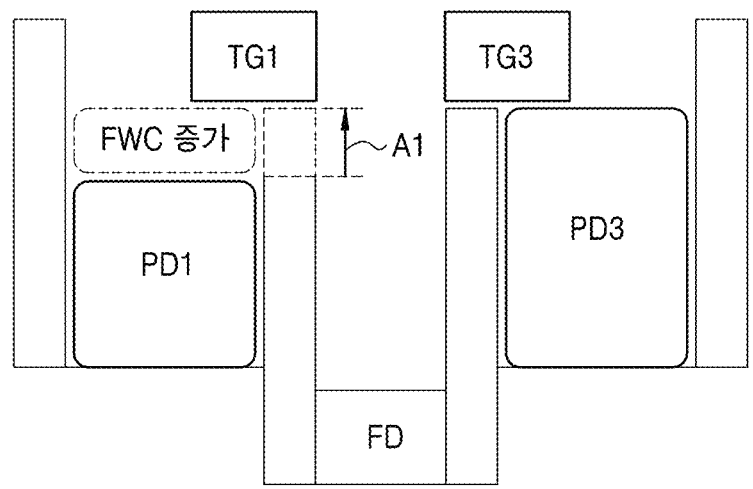
FIG. 6A and FIG. 6B are cross-sectional views taken along line VI-VI' of FIG. 5, illustrating a potential level when an off-voltage and an on-voltage are applied to transfer TRs.
Figure 6B:
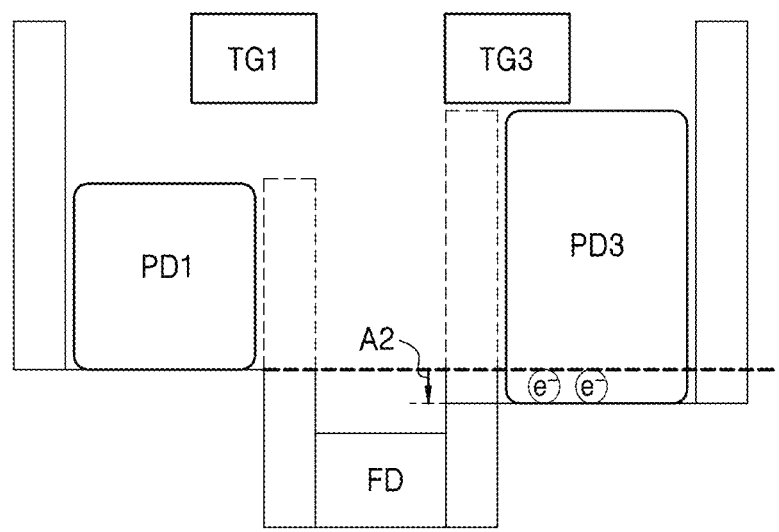

FIGS. 6A and 6B are cross-sectional views taken along line VI-VI' of FIG. 5, illustrating a potential level when an off-voltage and an on-voltage are applied to the transfer TRs 210. FIG. 6A illustrates a state where an off-voltage is applied to the first transfer TR 210-1 and the third transfer TR 210-3. FIG. 6B illustrates a state where an on-voltage is applied to the first transfer TR 210-1 and the third transfer TR 210-3. The first transfer gate electrode TG1 may be a gate electrode of the first transfer TR 210-1 and the third transfer gate electrode TG3 may be a gate electrode of the third transfer TR 210-3. The following will be explained with reference to FIG. 5.

Referring to FIG. 6A, when the same off-voltage is applied to the first transfer TR 210-1 and a third transfer TR 210-3, portions corresponding to the first and third transfer gate electrodes TG1 and TG3 may have different potential levels as marked by a solid line, for example, due to a process variation between pixels and/or a layout structure difference. As the portions corresponding to the first and third transfer gate electrodes TG1 and TG3 have different levels, an FWC of the first PD PD1 of a first pixel may be less than an FWC of the third PD PD3 of a third pixel, and thus a sensitivity difference may occur between the first PD PD1 and the third PD PD3 and electrical characteristics of the first pixel may be degraded due to a reduction in a sensitivity. Restated, the plurality of transfer transistors 210 included in the plurality of pixels may be configured to receive off-voltages having different magnitudes through a plurality of transfer transistor lines based on a potential magnitude of a full well capacity (FWC) of each photodiode PD of the plurality of photodiodes PD included in the plurality of pixels, respectively. The plurality of transfer transistors 210 included in the plurality of pixels may include a first set of transistors that correspond to photodiodes having a first full well capacity (FWC) potential magnitude and a separate, second set of transistors that correspond to photodiodes PD having a second full well capacity potential magnitude. The second full well capacity potential magnitude may be greater than the first full well capacity potential magnitude. The first set of transistors may be configured to receive a first off-voltage and the second set of transistors may be configured to receive a second off-voltage, where the second off-voltage has a magnitude that is greater than a magnitude of the first off-voltage.

When an off-voltage greater than that of the third transfer TR 210-3 is applied to the first transfer TR 210-1, for example, when an off-voltage that is a (−) voltage and has a greater absolute value is applied to the first transfer TR 210-1, a potential level may be increased by A1 as marked by a dashed line. The increased potential level A1 may act as a potential barrier to increase an FWC of the first PD PD1 to a level that is almost the same as that of an FWC of the third PD PD3. Accordingly, an FWC variation between the first PD PD1 and the third PD PD3 may be improved and electrical characteristics of the image sensor 200 may be improved by applying off-voltages of different levels to the first transfer TR 210-1 and the third transfer TR 210-3. Alternatively, an FWC variation may be improved by applying a weaker off-voltage to the third transfer TR 210-3 to reduce an FWC of the third PD PD3.

Referring to FIG. 6B, portions marked by dashed boxes indicate potential levels of portions corresponding to the first and third transfer gate electrodes TG1 and T3 before an on-voltage is applied, that is, when an off-voltage is applied, and are almost the same as portions marked by a solid line of FIG. 6A. In some example embodiments, a portion corresponding to a lower thick dashed line indicates a potential level when the same on-voltage is applied to the first transfer TR 210-1 and the third transfer TR 210-3 and shows that potential levels of the first transfer TR 210-1 and the third transfer TR 210-3 are almost the same.

As shown in FIGS. 6A and 6B, a base potential level ("base potential magnitude") of the third PD PD3 may be lower than that of the first PD PD1. For example, a base potential level of the third PD PD3 may be lower than a potential level when an on-voltage is applied. The third PD PD3 may have such a base potential level due to a process variation and/or a layout structure difference between pixels. When the third PD PD3 has such a base potential level and an on-voltage is applied, charges in the first PD PD1 may all move to an FD region FD whereas charges in the third PD PD3 may not all move to the FD region FD and some of the charges may remain in the third PD PD3. The charges remaining in the third PD PD3 may act as error factors of the image sensor 200 such as a leakage. Restated, the plurality of transfer transistors 210 included in the plurality of pixels may be configured to receive on-voltages having different magnitudes through the plurality of transfer transistor lines based on a base potential magnitude of each photodiode PD of the plurality of photodiodes PD included in the plurality of pixels, respectively. The plurality of transfer transistors 210 included in the plurality of pixels may include a third set of transistors that correspond to photodiodes PD having a first base potential magnitude and a separate, fourth set of transistors that correspond to photodiodes PD having a second base potential magnitude. The second base potential magnitude may be greater than the first base potential magnitude. The third set of transistors may be configured to receive a first on-voltage and the fourth set of transistors may be configured to receive a second on-voltage, and the first on-voltage may have a magnitude that is greater than the second on-voltage. The first and second sets of transistors may not be mutually exclusive from the third and fourth sets of transistors. For example, the third set of transistors may include transistors included in the first set of transistors.

When an on-voltage stronger than that of the first transfer TR 210-1 is applied to the third transfer TR 210-3, a potential level may be reduced by A2 as marked by a solid line. Accordingly, the potential level A2 acting as a potential barrier may be removed and the charges remaining in the third PD PD3 may all move to the FD region FD. As a result, electrical characteristics of the image sensor 200 may be improved.

Figure 7:
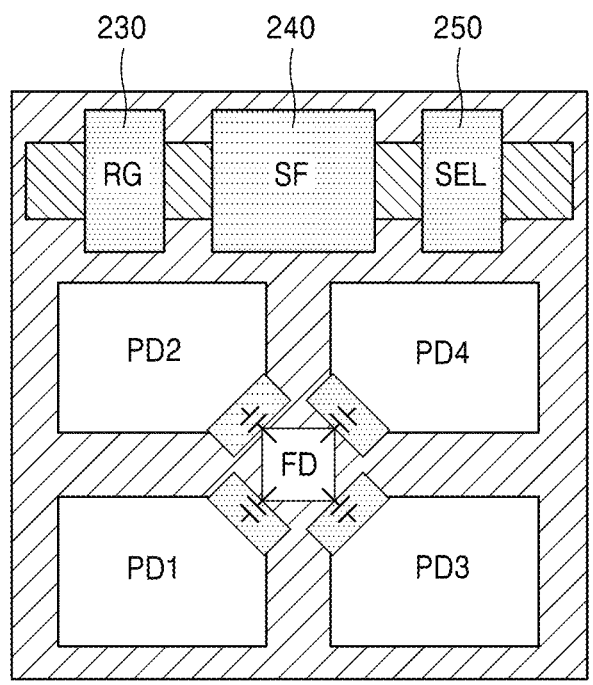
FIG. 7 is a conceptual diagram illustrating a unit shared pixel including TRs corresponding to a 4-shared pixel in the image sensor of FIG. 5.
Figure 8:
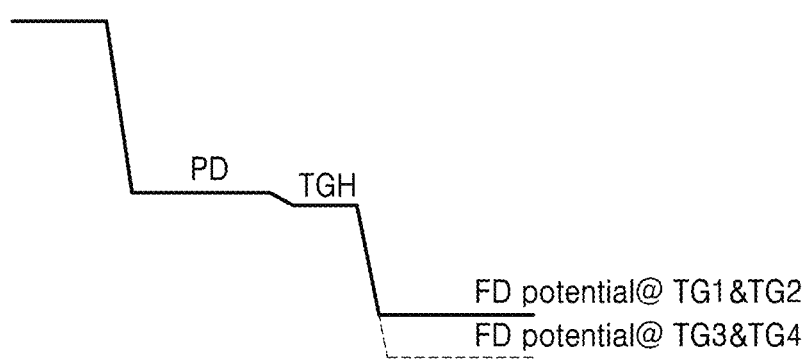
FIG. 8 is a graph showing potentials of a photodiode (PD), a transfer gate electrode, and a floating diffusion (FD) region in the unit shared pixel of FIG. 7.

FIG. 7 is a conceptual diagram illustrating a unit shared pixel including TRs corresponding to a 4-shared pixel in the image sensor 200 of FIG. 5. FIG. 8 is a graph showing potentials of a PD, a transfer gate electrode, and an FD region in the unit shared pixel of FIG. 7.

Referring to FIGS. 7 and 8, coupling states of the FD region and transfer gate electrodes respectively corresponding to the first through fourth PDs PD1 through PD4 may be different. For example, capacitances between the FD area and the transfer gate electrodes may be different, for example, due to a process variation between pixels and/or a layout structure difference.

According to a coupling state difference, as shown in the graph of FIG. 8, a potential level of the FD region FD when an on-voltage is applied to the first transfer gate electrode TG1 and the second transfer gate electrode TG2 and a potential level of the FD region FD when an on-voltage is applied to the third transfer gate electrode TG3 and the fourth transfer gate electrode TG4 may be different from each other. In contrast, voltage levels of the FD region FD when an on-voltage is applied to the first through fourth transfer gate electrodes TG1 through TG4 may be different from one another. A TGH portion indicates voltage levels of portions corresponding to the first through fourth transfer gate electrodes TG1 through TG4 when an on-voltage is applied.

A backflow may increase as a potential difference between the FD region FD and the first through fourth transfer gate electrodes TG1 through TG4 decreases. For example, a backflow may be large when an on-voltage is applied to the first transfer gate electrode TG1 and the second transfer gate electrode TG2. Accordingly, a voltage level of the TGH portion may be increased by reducing an on-voltage applied to the first transfer gate electrode TG1 and the second transfer gate electrode TG2, thereby limiting and/or preventing a backflow. In other words, a backflow may be avoided by making an on-voltage applied to the first transfer gate electrode TG1 and the second transfer gate electrode TG2 less than an on-voltage applied to the third transfer gate electrode TG3 and the fourth transfer gate electrode TG4.

Figure 9:
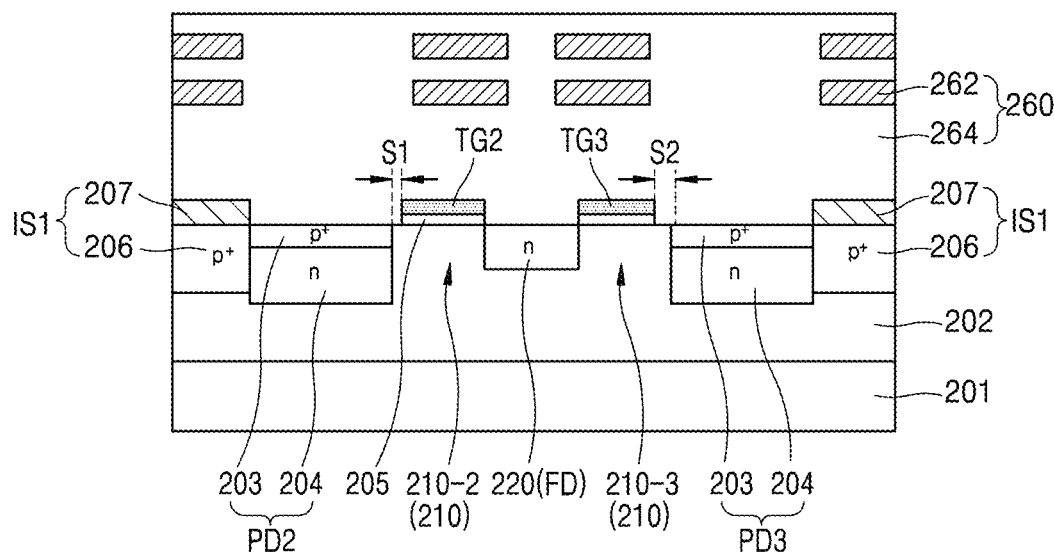
FIG. 9 is a cross-sectional view taken along line IX-IX' of the image sensor of FIG. 5.

FIG. 9 is a cross-sectional view taken along line IX-IX' of the image sensor 200 of FIG. 5. The following will be explained with reference to FIGS. 5 and 9.

Referring to FIG. 9, the first through fourth PDs PD1 through PD4 and the pixel TRs 210, 230, 240, and 250 may be formed in a semiconductor well region 202 formed on a semiconductor substrate 201. The semiconductor substrate 201 may be, for example, a p-type semiconductor substrate. However, the semiconductor substrate 201 is not limited to a p-type semiconductor substrate. The semiconductor well region 202 that is a p-type region may be formed on the semiconductor substrate 201, and the first through fourth PDs PD1 through PD4 and the pixel TRs 210, 230, 240, and 250 may be formed in the semiconductor well region 202. Each of the first through fourth PDs PD1 through PD4 may include a p-type semiconductor region 203 that is an upper region and an n-type semiconductor region 204 that is a lower region. The p-type semiconductor region 203 may be a p-type high concentration impurity region. The transfer TRs 210 may include the FD region 220 that is an n-type semiconductor region, the first through fourth PDs PD1 through PD4, and the first through fourth transfer gate electrodes TG1 through TG4, and the first through fourth transfer gate electrodes TG1 through TG4 may be formed on a gate insulating film 205. The FD region 220 may be an n-type high concentration impurity region. Although not shown in FIG. 9, the FD region 220 may be electrically connected to a source region of the reset TR 230 and the source follower gate electrode FG of the source follower TR 240 through a wiring 280.

A first device isolation region IS1 for separating the first through fourth PDs PD1 through PD4 may be formed in the pixel area PA. The first device isolation region IS1 may include an insulating film 207 that is an upper film and a semiconductor layer 206 that is a lower layer. The insulating film 207 may be, for example, an oxide film such as a silicon oxide (SiO2) film. The semiconductor layer 206 may be, for example, a p-type high concentration impurity layer. A second device isolation region IS2 for separating the reset TR 230, the source follower TR 240, and the selection TR 250 from the first through fourth PDs PD1 through PD4 may be formed in the TR area TA. The second device isolation region IS2 may include an insulating layer 208 that is an upper film and a semiconductor layer (not shown) that is a lower layer. The insulating layer 208 may be an oxide film such as a silicon oxide film and the semiconductor layer may be a p-type high concentration impurity layer.

In the image sensor 200 according to some example embodiments, although each of the first device isolation region IS1 and the second device isolation region IS2 includes an insulating film and a high concentration impurity layer, structures of the first device isolation region IS1 and the second device isolation region IS2 are not limited thereto. Although not shown in FIG. 9, device isolation regions formed between the pixel element 520 (see FIG. 15) and a peripheral circuit unit and in the peripheral circuit unit may each have a shallow trench isolation (STI) structure in which a trench formed in the semiconductor substrate 201 or the semiconductor well region 202 is filled with an insulating film.

A multi-layer wiring layer 260 may be formed on the first through fourth PDs PD1 through PD4, the FD region 220, and the transfer TRs 210 of the pixel area PA, and on the reset TR 230, the source follower TR 240, and the selection TR 250 of the TR area TA. The multi-layer wiring layer 260 may include, for example, a plurality of wirings 262 and an interlayer insulating film 264. The wirings 262 may include a part of the wiring 280 that electrically connects the FD region 220 to the source region of the reset TR 230 and the source follower gate electrode FG of the source follower TR 240. In some example embodiments, vertical contacts for vertically connecting the wirings 262 or connecting the wirings 262 to a gate electrode or a source/drain region may be included in the multi-layer wiring layer 260.

Although not shown in FIG. 9, a planarization film may be located on the multi-layer wiring layer 260, and color filters and micro-lenses may be located on the planarization film or color filters and micro-lenses may be located on a bottom surface of the semiconductor substrate 201. A structure in which color filters and micro-lenses are located on the multi-layer wiring layer 160 is referred to as a front side illumination (FSI) structure, and a structure in which color filters and micro-lenses are located on the bottom surface of the semiconductor substrate 201 is referred to as a back side illumination (BSI) structure.

In general, the transfer TRs 210 may be symmetric about the FD region 220, and also the first through fourth transfer gate electrodes TG1 through TG4 of the transfer TRs 210 may horizontally almost contact or overlap the first through fourth PDs PD1 through PD4 and the FD region 220. However, as shown in FIG. 9, transfer gate electrodes, for example, the second transfer gate electrode TG2 and the third transfer gate electrode TG3, may be horizontally spaced apart (e.g., isolated from direct contact with each other) from the second PD PD2 and the third PD PD3 due to a process variation and may be asymmetric with each other. For example, a first distance S1 between the second transfer gate electrode TG2 and the second PD PD2 and a second distance S2 between the third transfer gate TG3 and the third PD PD3 may be different from each other.

As such, due to a difference between structures of the first through fourth transfer gate electrodes TG1 through TG4 due to a process variation, a potential level difference may occur at an on-voltage or an off-voltage of the first through fourth transfer gate electrodes TG1 through TG4 as described above with reference to FIGS. 6A through 8, thereby degrading electrical characteristics of the image sensor 200.

Figure 10:
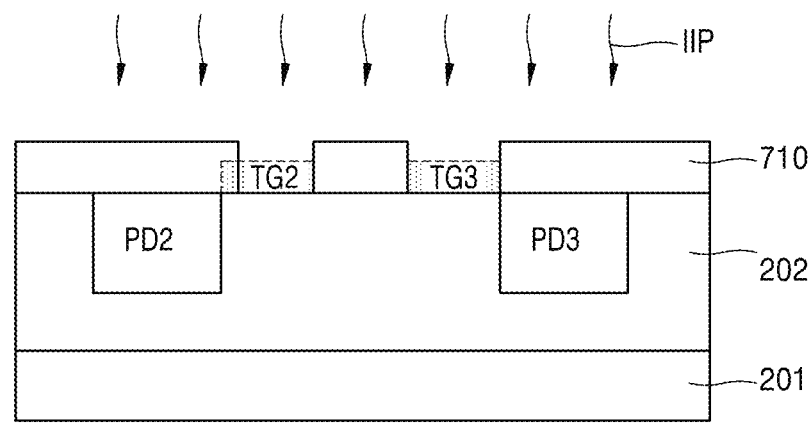
FIG. 10 is a cross-sectional view for explaining a process variation during a process of manufacturing an image sensor.

FIG. 10 is a cross-sectional view for explaining a process variation during a process of manufacturing an image sensor. The following will be explained with reference to FIGS. 5 and 10.

Referring to FIG. 10, during a process of manufacturing an image sensor, an ion implantation process IIP of implanting ions into an upper portion of the semiconductor well region 202 by using a PR mask 710 may be performed. In particular, before the first through fourth transfer gate electrodes TG1 through TG4 are formed, the ion implantation process IIP may be performed on lower portions of the first through fourth transfer gate electrodes TG1 through TG4. As shown in FIG. 10, portions where the first through fourth transfer gate electrodes TG1 through TG4 are to be formed, for example, a portion where the second transfer gate electrode TG2 is to be formed, may not be accurately opened and the implantation process IIP may be performed. Accordingly, electrical characteristics of the second transfer TR 210-2 of the second transfer gate electrode TG2 and the other transfer TRs 210-1, 210-3, and 210-4 may be different. For example, coupling characteristics between the second transfer gate electrode TG2 and the second PD PD2 or the FD region 220 may be different from coupling characteristics between the first, third, and fourth transfer gate electrodes TG1, TG3, and TG4 and the first, third, and fourth PDs PD1, PD3, and PD4 or the FD region 220.

As a result, a variation in the ion implantation process IIP may cause problems related to a potential level difference at an on-voltage or an off-voltage of the first through fourth transfer gate electrodes TG1 through TG4 and electrical characteristics of the image sensor as described above with reference to FIGS. 6A through 8.

Figure 11:
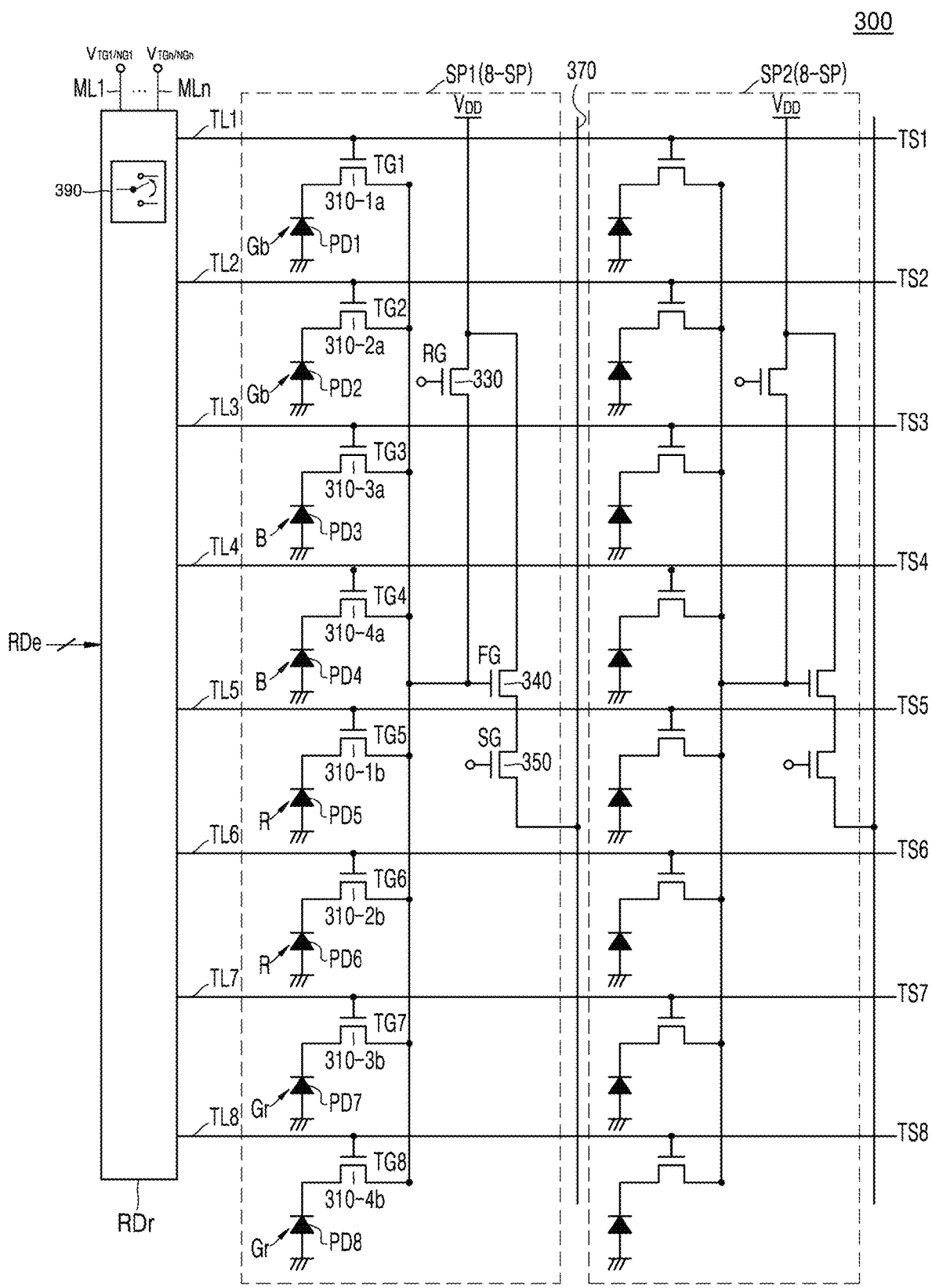
FIG. 11 is a circuit diagram illustrating pixels and transfer TR lines of an image sensor, according to some example embodiments.

FIG. 11 is a circuit diagram illustrating pixels and transfer TR lines of an image sensor 300 according to some example embodiments. FIG. 12 is a plan view illustrating major parts of a pixel element of the image sensor 300 of FIG. 11.

Referring to FIGS. 11 and 12, in the image sensor 300 according to some example embodiments, eight pixels may at least partially comprise a two-dimensional array of one or more 8-shared pixels 8-SPs. For example, the 8-shared pixel 8-SP may be configured so that four PD pairs PD1-PD2, PD3-PD4, PD5-PD6, and PD7-PD8 that are adjacent in the first direction (e.g., the x-direction) are arranged in the second direction (e.g., the y-direction). In some example embodiments, the 8-shared pixel 8-SP may include a first sub-shared pixel SSPa in which upper four PDs, that is, the first through fourth PDs PD1 through PD4, surround and share one upper FD region 320a and a second sub-shared pixel SSPb in which four lower PDs, that is, fifth through eighth PDs PD5 through PD8, surround and share one lower FD region 320b. The upper FD region 320a and the lower FD region 320b may act as one FD region 320 by being connected to each other through a wiring 380 to form an equipotential. Accordingly, the 8-shared pixel 8-SP may have a structure in which eight PDs, that is, the first through eighth PDs PD1 through PD8, share one FD region 320. The FD region 320 may be connected to a source region of a reset TR 330 through the wiring 380, and may also be connected to the source follower gate electrode FG of a source follower TR 340. Accordingly, the FD region 320, the source region of the reset TR 330, and the source follower gate electrode FG may form an equipotential.

In the 8-shared pixel 8-SP, sharing of one FD region 320 by eight PDs, that is, the first through eighth PDs PD1 through PD8, may be performed through transfer TRs 310 respectively corresponding to the first through eighth PDs PD1 through PD8 as shown in the circuit diagram of FIG. 11. In detail, in the first sub-shared pixel SSPa, four transfer TRs 310-1a through 310-4a corresponding to four PDs, that is, the first through fourth PDs PD1 through PD4, may share the upper FD region 320a as a common drain region. In some example embodiments, in the second sub-shared pixel SSPb, four transfer TRs 310-1b through 310-4b corresponding to four PDs, that is, the fifth through eighth PDs PD5 through PD8, may share the lower FD region 320b as a common source region. As described above, the upper FD region 320a and the lower FD region 320b may form one FD region 320 by being electrically connected to each other through the wiring 380.

The concept of sharing in the 8-shared pixel 8-SP may include not only sharing of one FD region 320 by eight PDs, that is, the first through eighth PDs PD1 through PD8, but also sharing of the reset TR 330, a dummy TR 390, a source follower TR 340, and a selection TR 350 located in the TR area TA. The dummy TR 390 may be located between the reset TR 330 and the source follower TR 340. The dummy TR 390 may function as a current path, and may be omitted if possible. Accordingly, the following will be explained on the assumption that the dummy TR 390 is omitted.

In the image sensor 300 according to some example embodiments, two PDs may at least partially comprise one pixel. For example, the first PD PD1 and the second PD PD2 may at least partially comprise the first pixel Px1, the third PD PD3 and the fourth PD PD4 may at least partially comprise the second pixel Px2, the fifth PD PD5 and the sixth PD PD6 may at least partially comprise the third pixel Px3, and the seventh PD PD7 and the eighth PD PD8 may at least partially comprise the fourth pixel Px4. As such, since two PDs at least partially comprise one pixel, grouping of first through eighth transfer TR lines TL1 through TL8 may be different between grouping according to PDs and grouping according to pixels. For example, when grouping is performed according to PDs, eight groups may be formed and eight main power lines, e.g., first through eighth ML1 through ML8, may be included in the image sensor. When grouping is performed according to pixels, four groups may be formed and four main power lines, e.g., the first through fourth main power lines ML1 through ML4, may be included in the image sensor.

A connection relationship between the transfer TRs 310, the FD region 320, the reset TR 330, and the selection TR 350 will now be explained with reference to the circuit diagram of FIG. 11. Four PDs, that is, the first through fourth PDs PD1 through PD4, of the first sub-shared pixel SSPa may be connected to source regions of the four transfer TRs 310-1a through 310-4a respectively corresponding to the first through fourth PDs PD1 through PD4. In some example embodiments, four PDs, that is, the fifth through eighth PDs PD5 through PD8, of the second sub-shared pixel SSPb may be connected to source regions of the four transfer TRs 310-1b through 310-4b respectively corresponding to the fifth through eighth PDs PDS through PD8. The transfer TRs 310 of the first sub-shared pixel SSPa and the second sub-shared pixel SSPb may share the FD region 320 including the upper FD region 320a and the lower FD region 320b as a common drain region. Structures, functions, and a connection relationship of the reset TR 330, the source follower TR 340, and the selection TR 350 located in the TR area TA are substantially the same as those of the image sensor 100 or 200 of FIG. 1A or 4, and thus a detailed explanation thereof will not be given.

In the image sensor 300 according to some example embodiments, a unit shared pixel may include one 8-shared pixel 8-SP and the reset TR 330, the source follower TR 340, and the selection TR 350 located in the TR area TA, and the transfer TRs 310 whose number corresponds to the number of shared PDs may be included in the 8-shared pixel 8-SP. For example, in the image sensor 300 according to some example embodiments, a unit shared pixel may include eight PDs, that is, the first through eighth PDs PD1 through PD8, eight transfer TRs 310, the reset TR 330, the source follower TR 340, and the selection TR 350. The image sensor 300 according to some example embodiments may be, for example, a CMOS image sensor.

Figure 13:
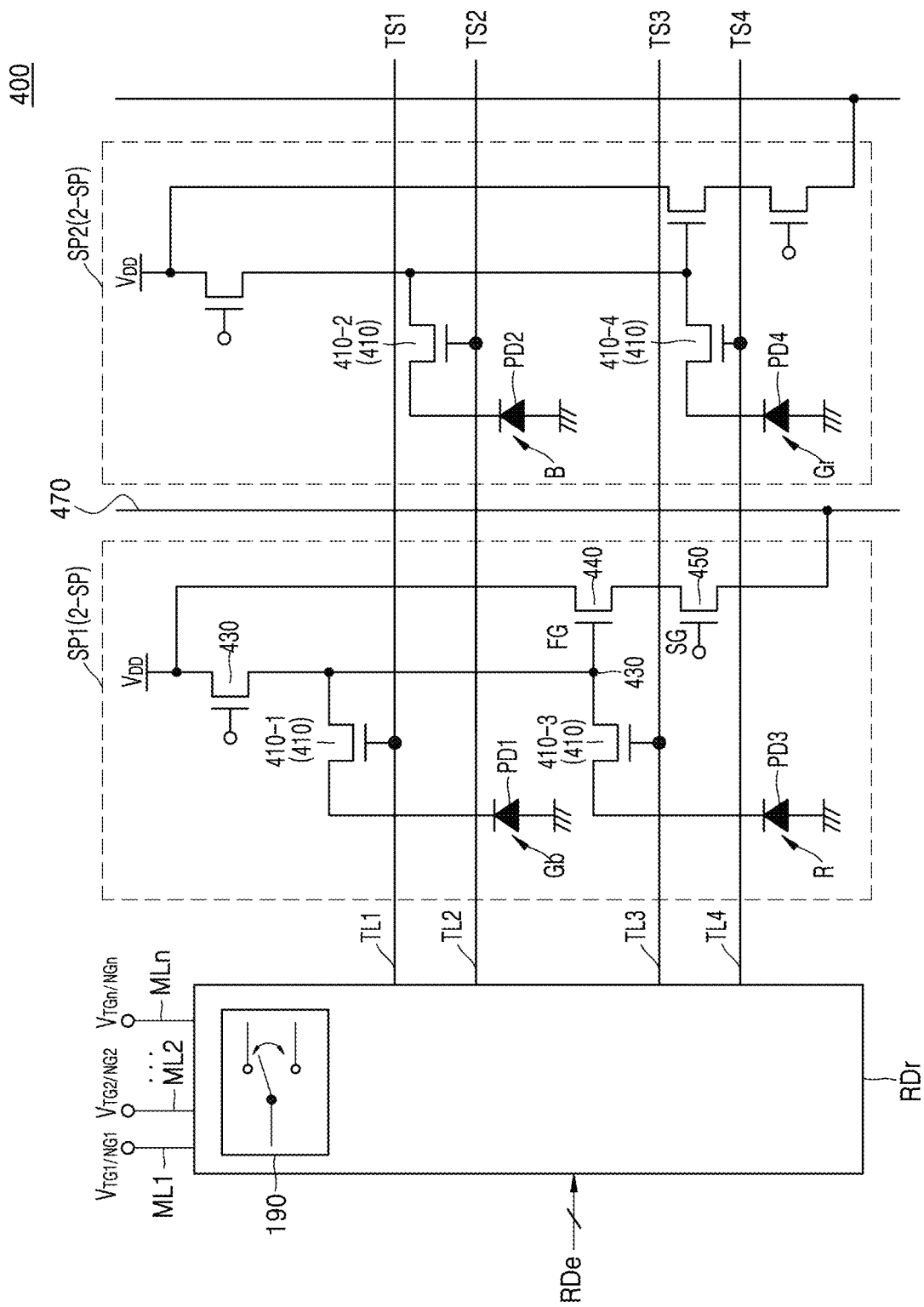
FIG. 13 is a circuit diagram illustrating pixels and transfer TR lines of an image sensor, according to some example embodiments.

FIG. 13 is a circuit diagram illustrating pixels and transfer TR lines of an image sensor 400 according to some example embodiments. FIG. 14 is a plan view illustrating major parts of a pixel element of the image sensor 400 of FIG. 13.

Referring to FIGS. 13 and 14, in the image sensor 400 according to some example embodiments, two pixels may at least partially comprise one 2-shared pixel 2-SP. For example, the 2-shared pixel 2-SP may include two PDs, e.g., the first and second PDs PD1 and PD2, that are adjacent in the second direction (e.g., the y-direction). In some example embodiments, the 2-shared pixel 2-SP may have a structure in which two PDs, e.g., the first and second PDs PD1 and PD2, vertically share one FD region 420.

In the 2-shared pixel 2-SP, sharing of one FD region 420 by two PDs, that is, the first and second PDs PD1 and PD2, may be performed through transfer TRs 410 respectively corresponding to the first and second PDs PD1 and PD2. In detail, two transfer TRs, that is, first and second transfer TRs 410-1 and 410-2, corresponding to the first and second PDs PD1 and PD2 may share the FD region 420 as a common drain region.

The concept of sharing in the 2-shared pixel 2-SP may include not only sharing of one FD region 420 by two PDs, that is, the first and second PDs PD1 and PD2, but also sharing of a reset TR 430, a source follower TR 440, and a selection TR 450 by the first and second PDs PD1 and PD2. The reset TR 430, the source follower TR 440, and the selection TR 450 may be located in the TR area TA that is adjacent to the pixel area PA.

As shown in FIG. 14, a structure of the 2-shared pixel 2-SP of the image sensor 400 according to some example embodiments may correspond to a half of a structure of the 4-shared pixel 4-SP of the image sensor 200 of FIG. 5. In other words, when two 2-shared pixels 2-SPs of the image sensor 400 according to some example embodiments are combined to be mirror-symmetric about the y-axis, the 4-shared pixel 4-SP of the image sensor 200 of FIG. 5 may be obtained. A structure of the 2-shared pixel 2-SP of the image sensor 400 according to some example embodiments would have been understood by using a structure of the 4-shared pixel 4-SP of the image sensor 200 of FIG. 5, and thus a detailed explanation thereof will not be given. In some example embodiments, structures, functions, and a connection relationship of the reset TR 430, the source follower TR 440, and the selection TR 450 of the image sensor 400 according to some example embodiments may be substantially the same as those of the reset TR 230, the source follower TR 240, and the selection TR 250 of the image sensor 200 of FIG. 4, and thus a detailed explanation will not be given.

In the image sensor 400 according to some example embodiments, a unit shared pixel may include two PDs, that is, the first and second PDs PD1 and PD2, two transfer TRs, that is, the first and second transfer TRs 410-1 and 410-2, the reset TR 430, the source follower TR 440, and the selection TR 450. The image sensor 400 according to some example embodiments may be, for example, a CMOS image sensor.

FIG. 15 is a diagram of an image sensor 500 according to some example embodiments.

Referring to FIG. 15, the image sensor 500 according to some example embodiments may include the pixel element 520 and a peripheral circuit unit. The pixel element 520 may be configured so that the plurality of pixels 510 each including a photoelectric conversion device are regularly arranged in a 2D array on a semiconductor substrate 501. The photoelectric conversion device may be, for example, a PD. In some example embodiments, each of the pixels 510 may be a unit pixel employed by any of the image sensors 100, and 100a of FIGS. 1A through 2, or a unit shared pixel including a shared pixel SP employed by any of the image sensors 200, 300, and 400 of FIGS. 4, 5, and 11 through 14 and TRs of the TR area TA corresponding to the shared pixel SP.

The peripheral circuit unit may be located around the pixel element 520, and may include a vertical drive circuit 540, a column signal processing circuit 550, a horizontal drive circuit 560, an output circuit 570, and a control circuit 580.

The control circuit 580 may control the vertical drive circuit 540, the column signal processing circuit 550, and the horizontal drive circuit 5690. For example, the control circuit 580 may generate a clock signal or control signals for operating the vertical drive circuit 540, the column signal processing circuit 550, and the horizontal drive circuit 560 based on a vertical synchronization signal, a horizontal synchronization signal, and a master clock. In some example embodiments, the control circuit 580 may input the clock signal or the control signals to the vertical drive circuit 540, the column signal processing circuit 550, and the horizontal drive circuit 560.

The vertical drive circuit 540 may include, for example, a shift register, and may select a pixel driving wiring, may supply a pulse for driving a pixel to the selected pixel driving wiring, and may drive a pixel row by row. For example, the vertical drive circuit 540 may vertically sequentially and selectively scan pulses to the pixels 510 row by row. In some example embodiments, the vertical drive circuit 540 may apply a pixel signal according to charges generated by a photoelectric conversion device, for example, a PD, of each pixel to the column signal processing circuit 550 through a vertical signal line 532. The vertical drive circuit 540 may correspond to the row drive circuit RDr of FIG. 1A.

The column signal processing circuit 550 may be located in each pixel column and may perform signal processing such as noise elimination on a signal output from one row of pixels 510 for every pixel column. For example, the column signal processing circuit 550 may perform signal processing such as correlated-double sampling (CDS) for eliminating a noise from the pixel 5140, signal amplification, or analog-to-digital (AD) conversion. A horizontal selection switch (not shown) may be provided on an output end of the column signal processing circuit 550.

The horizontal drive circuit 560 may include, for example, a shift register, and may sequentially output horizontal scan pulses, may sequentially select pixel signals of the column signal processing circuit 550, and may output the selected pixel signals to a horizontal signal line 534.

The output circuit 570 may perform signal processing on signals sequentially applied through the horizontal signal line 534 from the column signal processing circuit 550 and may output the processed signals. For example, the output circuit 570 may perform only buffering, or may perform black level adjustment, column non-uniformity correction, and various digital signal processing methods. An input/output terminal 590 may exchange a signal with an external apparatus.

Figure 16:
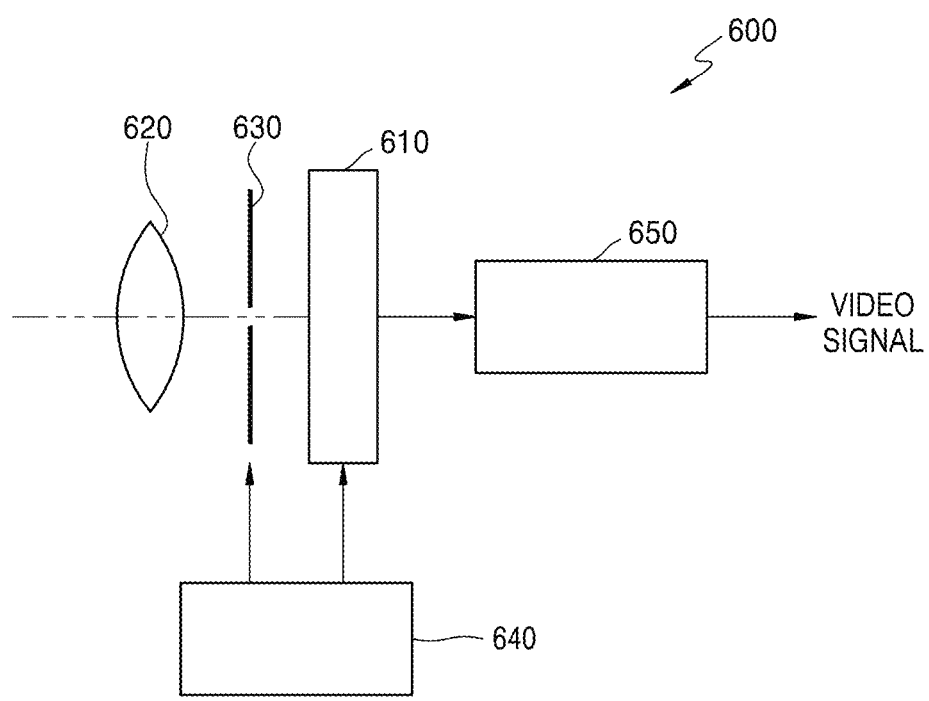
FIG. 16 is a view of an electronic apparatus including an image sensor, according to some example embodiments.

FIG. 16 is a view of an electronic apparatus 600 including an image sensor 610 according to some example embodiments.

Referring to FIG. 16, the electronic apparatus 600 according to some example embodiments may include the image sensor 610, an optical system 620, a shutter 630, a driving circuit 640, and a signal processing circuit 650.

Each of the pixels 510 of the image sensor 610 may be a unit pixel employed by any of the image sensors 100, and 100*a* of FIGS. 1A through 2, or a unit shared pixel including the shared pixel SP employed by any of the image sensors 200, 300, and 400 of FIGS. 4, 5, and 11 through 14 and TRs of the TR area TA corresponding to the shared pixel SP.

The image sensor 610 may include a pixel element and a peripheral circuit unit as shown in FIG. 15.

The optical system 620 for guiding incident light to a light-receiving unit of the image sensor 610 may include a plurality of optical lenses. For example, the optical system 620 may focus incident light from an object on an image-forming surface of the image sensor 610, and thus charges may be generated and accumulated in the image sensor 610.

The shutter 630 may control a light-emitting time for which light is emitted to the image sensor 610 and a light-shielding time. The driving circuit 640 may apply a driving signal for controlling an operation of the shutter 630 and a transfer operation of the image sensor 610. The image sensor 610 may perform signal transmission in response to a driving signal (or a timing signal) applied from the driving circuit 640.

The signal processing circuit 650 may perform various signal processing methods on an output signal of the image sensor 610. A video signal on which signal processing has been performed may be stored in a storage medium such as a memory or may be output to a monitor.

The electronic apparatus 600 according to some example embodiments may be, for example, a CMOS camera for capturing a still image or a moving image.

An image sensor and an electronic apparatus including the same according to the inventive concepts may appropriately connect main power lines configured to supply voltages of different levels to transfer TR lines by using a connection controller. Accordingly, voltages of different levels, that is, transfer control signals, may be applied to transfer TRs in pixels through the transfer TR lines. The voltages of different levels of the transfer control signals may be voltages for optimizing operations of the transfer TRs according to pixels and/or PDs.

Accordingly, since the image sensor and the electronic apparatus including the same of the inventive concepts optimize operations of the transfer TRs according to pixels and/or PDs, electrical characteristics, for example, an FWC, an image lag, a backflow or electron backflow, or a leakage, of the image sensor may be improved and wafer yield may also be improved.

While the inventive concepts have been particularly shown and described with reference to example embodiments thereof, it will be understood that various changes in form and details may be made therein without departing from the spirit and scope of the following claims. Accordingly, the technical scope of the inventive concepts has to be defined by the following claims.

What is claimed is:
1. An image sensor comprising:
a two-dimensional array of 4-shared pixels extending in a first direction and a perpendicular second direction, each given 4-shared pixel including
four photodiodes,
one floating diffusion region shared by the four photodiodes, and
four transfer transistors configured to transfer charges accumulated in the four photodiodes to the floating diffusion region; and
four transfer transistor lines connected to gate electrodes of the four transfer transistors of the given 4-shared pixel, respectively,
wherein the four transfer transistor lines of the given 4-shared pixel extend in the first direction or the second direction,
wherein at least two transfer transistor lines of the four transfer transistor lines are configured to receive differing transfer control signals, the differing transfer control signals including at least one of,
on-voltages having different respective magnitudes, such that separate transfer transistor lines receive separate respective on-voltages having different magnitudes, or
off-voltages having different respective magnitudes, such that separate transfer transistor lines receive separate respective off-voltages having different magnitudes,
wherein the off-voltages of the differing transfer control signals have different magnitudes based on a potential magnitude of a full well capacity of each photodiode of the four photodiodes included in the given 4-shared pixel, respectively, and wherein the on-voltages of the differing transfer control signals have different magnitudes based on a base potential magnitude of each photodiode of the four photodiodes included in the 4-shared pixel, respectively.

2. The image sensor of claim 1, wherein each transfer transistor line of the four transfer transistor lines of the given 4-shared pixel are configured to receive voltages having different magnitudes.

3. The image sensor of claim 1, wherein,
in each given 4-shared pixel, each photodiode PD is a separate pixel and four pixels are located in a first quadrant, a second quadrant, a third quadrant, and a fourth quadrant at least partially surrounding the floating diffusion region, respectively,
the four transfer transistor lines of the given 4-shared pixel include two first transfer transistor lines corresponding to the pixels located in the first quadrant and the second quadrant and two second transfer transistor lines corresponding to the pixels located in the third quadrant and the fourth quadrant,
the two first transfer transistor lines and the two second transfer transistor lines extend in the first direction, and
the first transfer transistor lines are configured to receive a voltage having a magnitude that is different from a magnitude of a voltage received at the two second transfer transistor lines.

4. The image sensor of claim 1, wherein each given 4-shared pixel includes four pixels corresponding to one red channel, one blue channel, and two green channels of a plurality of channels, respectively, and the four transfer transistor lines are configured to receive voltages having different magnitudes according to the plurality of channels.

5. The image sensor of claim 1, wherein each transfer transistor line of the four transfer transistor lines is configured to receive a voltage that is at least one voltage of an on-voltage and an off-voltage of the transfer transistor configured to receive the voltage.

6. The image sensor of claim 1, wherein the four transfer transistors included in the given 4-shared pixel includes a first set of transistors that correspond to photodiodes having a first full well capacity potential magnitude and a separate, second set of transistors that correspond to photodiodes having a second full well capacity potential magnitude, the second full well capacity potential magnitude is greater than the first full well capacity potential magnitude, the first set of transistors are configured to receive a first differing transfer control signal including a first off-voltage and the second set of transistors are configured to receive a second differing transfer control signal including a second off-voltage, the second off-voltage having a magnitude that is greater than a magnitude of the first off-voltage, and
the four transfer transistors included in the given 4-shared pixel includes a third set of transistors that correspond to photodiodes having a first base potential magnitude and a separate, fourth set of transistors that correspond to photodiodes having a second base potential magnitude, the second base potential magnitude is greater than the first base potential magnitude, the third set of transistors are configured to receive a third differing transfer control signal including a first on-voltage and the fourth set of transistors are configured to receive a fourth differing transfer control signal including a second on-voltage, and the first on-voltage has a magnitude that is greater than the second on-voltage.

7. The image sensor of claim 1, further comprising:
a connection controller configured to connect the four transfer transistor lines and a main power line,
wherein the main power line is configured to supply either at least two voltages having different magnitudes or a voltage of having one magnitude,
wherein the connection controller includes a switching device or a variable resistor, and the connection controller is configured to supply voltages having different magnitudes to the four transfer transistor lines.

8. An image sensor, comprising:
a two-dimensional array of 8-shared pixels extending in a first direction and a second perpendicular direction, each given 8-shared pixel including
eight photodiodes,
two floating diffusion regions shared by the eight photodiodes, the two floating diffusion regions electrically connected to each other,
eight transfer transistors configured to transfer charges accumulated in the eight photodiodes to the two floating diffusion regions, and
eight transfer transistor lines connected to gate electrodes of the eight transfer transistors of the given 8-shared pixel, respectively,
wherein each given 8-shared pixel includes two sub-shared pixels, each sub-shared pixel sharing one floating diffusion region and including four photodiodes,
wherein at least two transfer transistor lines of the eight transfer transistor lines are configured to receive differing transfer control signals, the differing transfer control signals including at least one of,
on-voltages having different respective magnitudes, such that separate transfer transistor lines receive separate respective on-voltages having different magnitudes, or
off-voltages having different respective magnitudes, such that separate transfer transistor lines receive separate respective off-voltages having different magnitudes,
wherein the off-voltages of the differing transfer control signals have different magnitudes based on a potential magnitude of a full well capacity of each photodiode of the eight photodiodes included in the given 8-shared pixel, respectively wherein the on-voltages of the differing transfer control signals have different magnitudes based on a base potential magnitude of each photodiode of the eight photodiodes included in the given 8-shared pixel, respectively.

9. The image sensor of claim 8, wherein,
in each given 8-shared pixel, the given 8-shared pixel includes four pixels and each separate pixel includes two adjacent photodiodes of the given 8-shared pixel, and
the eight transfer transistor lines of the given 8-shared pixel are configured to receive voltages having different magnitudes according to the four pixels of the 8-shared pixel.

10. The image sensor of claim 8, wherein,
in each sub-shared pixel of the two sub-shared pixels, the four photodiodes are respectively located in a first quadrant, a second quadrant, a third quadrant, and a fourth quadrant at least partially surrounding the floating diffusion region,
four first transfer transistor lines corresponding to the photodiodes located in the first quadrant of each sub-shared pixel and the second quadrant of each sub-shared pixel extended in the first direction, four second transfer transistor lines corresponding to the photodiodes located in the third quadrant of each sub-shared pixel and the fourth quadrant of each sub-shared pixel extend in the first direction, and the four first transfer transistor lines are configured to receive a voltage having a different magnitude than a voltage received at the four second transfer transistor lines.

11. The image sensor of claim 8, wherein, each given 8-shared pixel includes four pixels that each include two adjacent photodiodes of the eight photodiodes of the given 8-shared pixel, and the four pixels correspond to one red channel, one blue channel, and two green channels of a plurality of channels, and the eight transfer transistor lines are configured to receive voltages having different magnitudes according to the plurality of channels.

12. The image sensor of claim 8, wherein each transfer transistor line of the eight transfer transistor lines is configured to receive a voltage that is at least one voltage of an on-voltage and an off-voltage of the transfer transistor configured to receive the voltage.

13. An electronic apparatus comprising:

an optical system;

an image sensor; and a signal processing circuit, wherein the image sensor includes a pixel element and a peripheral circuit at least partially surrounding the pixel element, the pixel element including a plurality of pixels and a plurality of transfer transistor lines, wherein each pixel of the plurality of pixels includes a photodiode and a transfer transistor configured to transfer charges accumulated in the photodiode to a floating diffusion region, wherein the plurality of transfer transistor lines are connected to gate electrodes of the transfer transistors corresponding to the transfer transistor lines, respectively, wherein at least two transfer transistor lines, of the plurality of transfer transistor lines, are configured to receive differing transfer control signals, the differing transfer control signals including at least one of, on-voltages having different respective magnitudes, such that separate transfer transistor lines receive separate respective on-voltages having different magnitudes, or off-voltages having different respective magnitudes, such that separate transfer transistor lines receive separate respective off-voltages having different magnitudes wherein the plurality of transfer transistors included in the plurality of pixels are configured to receive the off-voltages through the plurality of transfer transistor lines based on the potential magnitude of a full well capacity of each photodiode of the photodiodes included in the plurality of pixels, respectively, and wherein the plurality of transfer transistors included in the plurality of pixels are configured to receive the on-voltages through the plurality of transfer transistor lines based on a base potential magnitude of each photodiode of the photodiodes included in the plurality of pixels, respectively.

14. The electronic apparatus of claim 13, wherein, the pixels are located in a common pixel area, and the plurality of pixels have a shared pixel structure, such that an even quantity of the photodiodes of the plurality of pixels share the floating diffusion region, the at least two transfer transistor lines, of the plurality of transfer transistor lines, extend in a first direction and are isolated from direct contact with each other.

15. The electronic apparatus of claim 13, wherein, the plurality of pixels are located in a pixel area and have a 4-shared pixel structure, such that the 4-shared pixel structure includes four photodiodes sharing the floating diffusion region, the 4-shared pixel structure includes four transfer transistor lines, the 4-shared pixel structure includes four pixels, each separate pixel including a separate photodiode, and the four pixels included in the 4-shared pixel structure correspond to one red channel, one blue channel, and two green channels of a plurality of channels, respectively, and the four transfer transistor lines are configured to receive voltages having different magnitudes according to the plurality of channels; or the plurality of pixels are located in the pixel area and have an 8-shared pixel structure, such that the 8-shared pixel structure including eight photodiodes sharing two floating diffusion regions, the 8-shared pixel structure includes eight transfer transistor lines, the 8-shared pixel includes four pixels and each separate pixel includes two adjacent photodiodes, and the four pixels included in the 8-shared pixel correspond to one red channel, one blue channel, and two green channels of a plurality of channels, respectively, and the eight transfer transistor lines are configured to receive voltages having different magnitudes according to the plurality of channels.

16. The electronic apparatus of claim 13, wherein, the peripheral circuit includes:

a vertical drive circuit, a column signal processing circuit, a horizontal drive circuit, an output circuit, and a control circuit, wherein the vertical drive circuit includes a connection controller configured to connect the plurality of transfer transistor lines and a main power line.

17. The electronic apparatus of claim 16, wherein the main power line is configured to supply either at least two voltages having different magnitudes or a voltage of having one magnitude, wherein the connection controller includes a switching device or a variable resistor, and the connection controller is configured to supply voltages having different magnitudes to the plurality of transfer transistor lines.

* * * * *